US012642005B2

(12) United States Patent
Yang et al.

(10) Patent No.: US 12,642,005 B2
(45) Date of Patent: May 26, 2026

(54) CONTROL METHOD FOR SIDEWALL CONTAMINATION OF MRAM MAGNETIC TUNNEL

(71) Applicant: JIANGSU LEUVEN INSTRUMENTS CO. LTD, Xuzhou (CN)

(72) Inventors: Yuxin Yang, Xuzhou (CN); Jiahe Li, Xuzhou (CN); Taiyan Peng, Xuzhou (CN); Dongdong Hu, Xuzhou (CN); Kaidong Xu, Xuzhou (CN)

(73) Assignee: JIANGSU LEUVEN INSTRUMENTS CO. LTD, Xuzhou (CN)

( * ) Notice: Subject to any disclaimer, the term of this patent is extended or adjusted under 35 U.S.C. 154(b) by 276 days.

(21) Appl. No.: 18/687,465

(22) PCT Filed: Dec. 2, 2021

(86) PCT No.: PCT/CN2021/134975
§ 371 (c)(1),
(2) Date: Feb. 28, 2024

(87) PCT Pub. No.: WO2023/029260
PCT Pub. Date: Mar. 9, 2023

(65) Prior Publication Data
US 2024/0407267 A1 Dec. 5, 2024

(30) Foreign Application Priority Data
Aug. 30, 2021 (CN) .......................... 202111006194.2

(51) Int. Cl.
H10N 50/01 (2023.01)
H10B 61/00 (2023.01)
(Continued)

(52) U.S. Cl.
CPC ............. H10N 50/01 (2023.02); H10B 61/00 (2023.02); H10N 50/10 (2023.02); H10P 50/242 (2026.01); C23F 4/00 (2013.01); C23F 4/04 (2013.01)

(58) Field of Classification Search
CPC ........ H10N 50/01; H10N 50/10; H10B 61/00; H10P 50/242; C23F 4/00; C23F 4/04
See application file for complete search history.

(56) References Cited

U.S. PATENT DOCUMENTS 9,166,154 B2 * 10/2015 Satoh ...................... H10N 50/01
9,893,121 B2 * 2/2018 Sonoda .................. H10N 50/01
(Continued)

FOREIGN PATENT DOCUMENTS

CN 104518082 A 4/2015
CN 109065480 A 12/2018
(Continued)

OTHER PUBLICATIONS

International Search Report of the ISA, issued in PCT/CN2021/134975, mailed May 9, 2022; ISA/CN.
(Continued)

*Primary Examiner* — Anita K Alanko
(74) *Attorney, Agent, or Firm* — Harness, Dickey & Pierce, P.L.C.

(57) ABSTRACT

The present invention provides a control method for sidewall contamination of an MRAM magnetic tunnel. In the control method, there is no need to additionally coat an insulation protection layer on the sidewall of an MTJ layer, but a unique funnel-shaped trench is formed during the etching process; the funnel-shaped trench comprises a first area away from a plane where a substrate is located and a second area adjacent to the plane where the substrate is located; the size of the first area in a first direction gradually
(Continued)

increases, and the size of the second area in the first direction does not change; and in removing metal contamination on the bottom of the funnel-shaped trench, the funnel-shaped trench can prevent the metal contamination from being attached to the sidewall of the MTJ layer, so as to improve the apparatus performance of an MRAM.

14 Claims, 13 Drawing Sheets

(51) Int. Cl.

| | |
|---|---|
| *H10N 50/10* | (2023.01) |
| *H10P 50/24* | (2026.01) |
| *C23F 4/00* | (2006.01) |
| *C23F 4/04* | (2006.01) |

(56)                    References Cited

U.S. PATENT DOCUMENTS

| | | |
|---|---|---|
| 2010/0159669 A1 | 6/2010 | Lee |
| 2014/0138347 A1 | 5/2014 | Toyosato et al. |
| 2015/0287911 A1 | 10/2015 | Kim et al. |
| 2016/0218280 A1 | 7/2016 | Park et al. |
| 2016/0380028 A1 | 12/2016 | Sonoda et al. |
| 2018/0033957 A1 | 2/2018 | Zhang et al. |
| 2020/0066973 A1 | 2/2020 | Yang et al. |
| 2020/0106008 A1 | 4/2020 | Peng et al. |
| 2021/0351343 A1 | 11/2021 | Xu et al. |
| 2021/0376232 A1 | 12/2021 | Wang et al. |
| 2021/0399216 A1 | 12/2021 | Liu et al. |
| 2022/0131071 A1 | 4/2022 | Lill et al. |
| 2023/0345840 A1* | 10/2023 | Li ......................... H10N 50/10 |

FOREIGN PATENT DOCUMENTS

| | | |
|---|---|---|
| CN | 111146335 A | 5/2020 |
| CN | 111162005 A | 5/2020 |
| CN | 112635659 A | 4/2021 |
| JP | 2013201343 A | 10/2013 |
| KR | 20100075250 A | 7/2010 |
| KR | 20160091504 A | 8/2016 |
| KR | 20200037058 A | 4/2020 |
| TW | 201535811 A | 9/2015 |
| TW | 202023049 A | 6/2020 |
| TW | 202101796 A | 1/2021 |

OTHER PUBLICATIONS

Chinese First Office Action regarding Application No. 202111006194. 2, dated Jul. 7, 2025, with English translation.
Extended European Search Report regarding Application No. 21955788. 1, dated Jul. 18, 2025.
Islam, Rabiul et al, "Dry etching strategy of spin-transfer-torque magnetic random access memory: A review", Journal of Vacuum Science, American Institute of Physics, 2 Huntington Quadrangle, Melville, NY 11747, vol. 38, No. 5, Aug. 12, 2020 (Aug. 12, 2020), XP012249309, ISSN: 2166-2746, DOI: 10.1116/6.0000205.
Korean First Office Action regarding Application No. 10-2024-7010514, dated Dec. 17, 2024, with English translation.
Taiwanese First Office Action regarding Application No. 110143836, dated Sep. 22, 2022, with English translation.

* cited by examiner

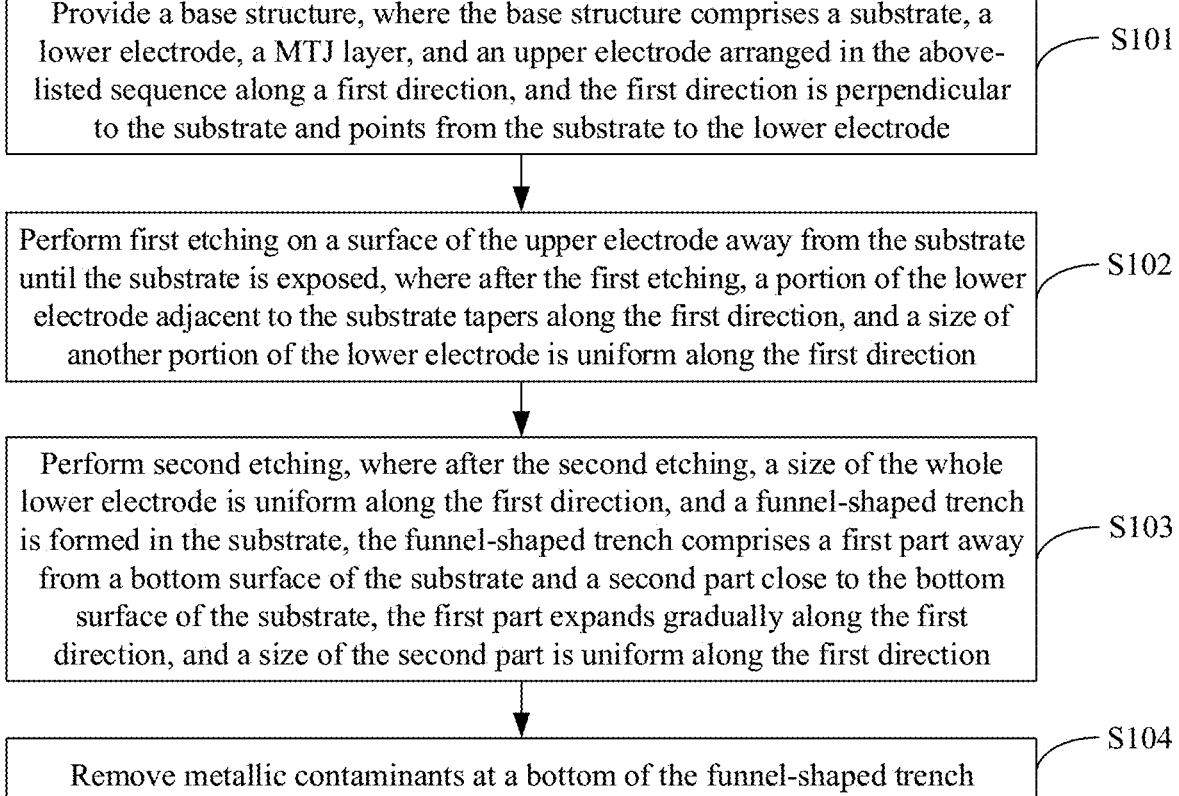

Provide a base structure, where the base structure comprises a substrate, a lower electrode, a MTJ layer, and an upper electrode arranged in the above-listed sequence along a first direction, and the first direction is perpendicular to the substrate and points from the substrate to the lower electrode — S101

Perform first etching on a surface of the upper electrode away from the substrate until the substrate is exposed, where after the first etching, a portion of the lower electrode adjacent to the substrate tapers along the first direction, and a size of another portion of the lower electrode is uniform along the first direction — S102

Perform second etching, where after the second etching, a size of the whole lower electrode is uniform along the first direction, and a funnel-shaped trench is formed in the substrate, the funnel-shaped trench comprises a first part away from a bottom surface of the substrate and a second part close to the bottom surface of the substrate, the first part expands gradually along the first direction, and a size of the second part is uniform along the first direction — S103

Remove metallic contaminants at a bottom of the funnel-shaped trench — S104

Figure 7

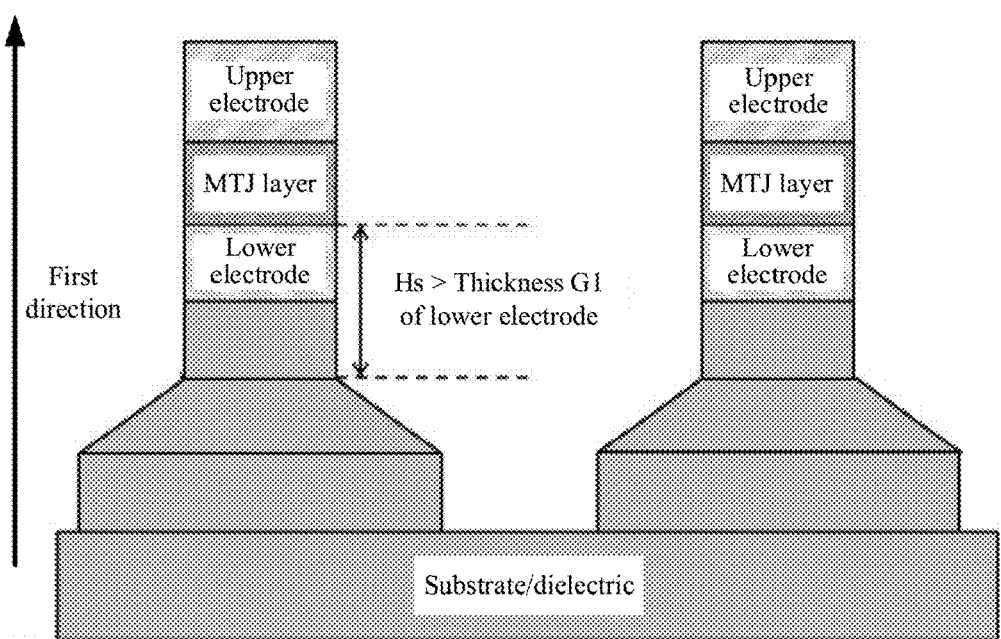

Figure 14

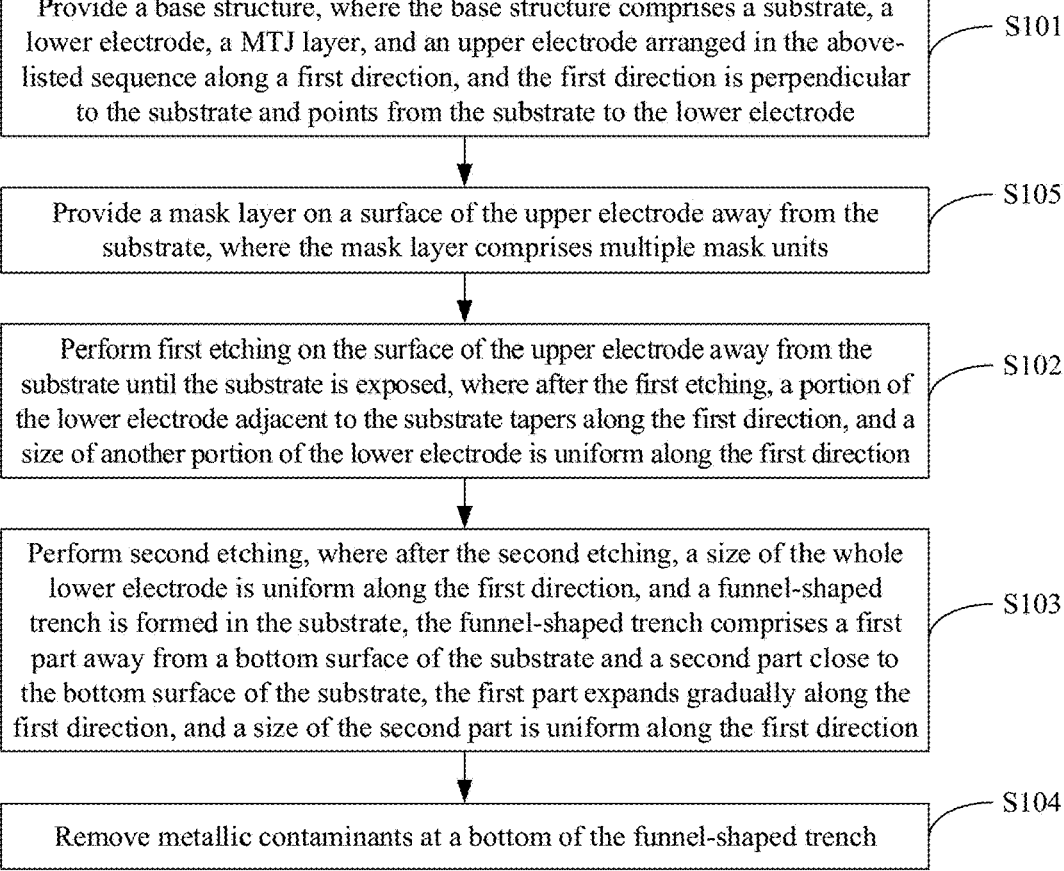

Provide a base structure, where the base structure comprises a substrate, a lower electrode, a MTJ layer, and an upper electrode arranged in the above-listed sequence along a first direction, and the first direction is perpendicular to the substrate and points from the substrate to the lower electrode — S101

Provide a mask layer on a surface of the upper electrode away from the substrate, where the mask layer comprises multiple mask units — S105

Perform first etching on the surface of the upper electrode away from the substrate until the substrate is exposed, where after the first etching, a portion of the lower electrode adjacent to the substrate tapers along the first direction, and a size of another portion of the lower electrode is uniform along the first direction — S102

Perform second etching, where after the second etching, a size of the whole lower electrode is uniform along the first direction, and a funnel-shaped trench is formed in the substrate, the funnel-shaped trench comprises a first part away from a bottom surface of the substrate and a second part close to the bottom surface of the substrate, the first part expands gradually along the first direction, and a size of the second part is uniform along the first direction — S103

Remove metallic contaminants at a bottom of the funnel-shaped trench — S104

Figure 15

CONTROL METHOD FOR SIDEWALL CONTAMINATION OF MRAM MAGNETIC TUNNEL

This application is the national phase of International Application No. PCT/CN2021/134975, titled "CONTROL METHOD FOR SIDEWALL CONTAMINATION OF MRAM MAGNETIC TUNNEL", filed on Dec. 2, 2021, which claims priority to Chinese Patent Application No. 202111006194.2, titled "METHOD FOR CONTROLLING CONTAMINANTS ON SIDEWALL OF MAGNETIC TUNNEL JUNCTION OF MRAM", filed on Aug. 30, 2021 with the China National Intellectual Property Administration, which are incorporated herein by reference in their entirety.

FIELD

The present disclosure relates to the technical field of semiconductor-chip manufacture, and in particular to a method for controlling contaminants on a sidewall of a magnetic tunnel junction of a MRAM.

BACKGROUND

Continuous development of science and technology engenders wide application of various memories in people's lives and work, which brings great convenience.

Magnetic random access memories (MRAMs) are a new type of random access memories in the market. The MRAMs have higher reading/writing speed than that of conventional flash memories, and have radiation resistance and non-volatility which are lacked in traditional dynamic random-access memories (DRAMs) and static random-access memories (SRAMs). The MRAMs alone can achieve various storage functions which once can be implemented only by a combination of the three traditional types of memories.

A layer of metallic contaminants would be formed on a sidewall of a magnetic tunnel junction of the MRAM when manufacturing the magnetic tunnel junction using conventional techniques. The layer of metallic contaminants may result in a failure of the MRAM.

SUMMARY

In order to address at least the above issue, a method for controlling contaminants on a sidewall of a magnetic tunnel junction (MTJ) of a magnetic random access memory (MRAM) is provided according to embodiments of the present disclosure. The technical solutions are as follows.

A method for controlling contaminants on a sidewall of magnetic tunnel of a MRAM is provided according to embodiments of the present disclosure. The method comprises: providing a base structure, where the base structure comprises a substrate, a lower electrode, a MTJ layer, and an upper electrode, which are arranged in the above-listed sequence along a first direction, and the first direction is perpendicular to the substrate and points from the substrate to the lower electrode; performing first etching on a surface of the upper electrode away from the substrate, until the substrate is exposed, where after the first etching, a portion of the lower electrode adjacent to the substrate tapers along the first direction, and a size of another portion of the lower electrode is uniform along the first direction; performing second etching after the first etching, where after the second etching, a size of the whole lower electrode is uniform along the first direction, and a funnel-shaped trench is formed in the substrate, the funnel-shaped trench comprises a first part away from a bottom surface of the substrate and a second part close to the bottom surface of the substrate, the first part expands gradually along the first direction, and a size of the second part is uniform along the first direction; and removing metallic contaminants at a bottom of the funnel-shaped trench.

In an embodiment, a distance Hs between a surface of the MTJ layer away from the upper electrode and a surface of the first part away from the second part is greater than or equal to a thickness G1 of the lower electrode along the first direction.

In an embodiment, performing the first etching on the surface of the upper electrode away from the substrate until the substrate is exposed comprises: performing the first etching on the surface of the upper electrode away from the substrate through ion beam etching, until the substrate is exposed.

In an embodiment, in the ion beam etching, energy of ions ranges from 50 V to 600 V, a voltage for accelerating the ions ranges from 50 V to 1000 V, and a flow rate of a gas ranges from 10 sccm to 500 sccm.

In an embodiment, a gas for the ion beam etching comprises one or more of: an inert gas, nitrogen, oxygen, a fluorine-based gas, an amine gas, carbon monoxide, carbon dioxide, and an alcohol gas.

In an embodiment, before performing the first etching on the surface of the upper electrode away from the substrate, the method further comprises: forming a mask layer on the surface of the upper electrode away from the substrate, where the mask layer comprises multiple mask units.

In an embodiment, in the ion beam etching, an incident angle of an ion beam is greater than A1 and less than A3, where:

$$A1 = \arctan\left(\frac{X}{Y1}\right), \quad A2 = \arctan\left(\frac{X}{Y2}\right),$$

$0 < A3 - A2 \leq 5°$, $Y1 = Y2 + Y3$, X is a distance between every two adjacent ones of the multiple mask units, Y2 is a total thickness of the lower electrode, the MTJ layer, and the upper electrode along the first direction, and Y3 is a thickness of each of the multiple mask units along the first direction.

In an embodiment, performing the second etching comprises performing the second etching through reactive ion etching.

In an embodiment, in the reactive ion etching, a value of a direct-current bias voltage is less than or equal to a value of energy of ions for the ion beam etching.

In an embodiment, in the reactive ion etching, a selectivity ratio between dielectric etching and metal etching is greater than 1.5.

In an embodiment, in the reactive ion etching, a thickness of a removed part of the substrate is greater than 10 nm.

In an embodiment, in the reactive ion etching, power of a source electrode ranges from 100 W to 1000 W, power of a bias electrode ranges from 100 W to 1500 W, pressure in an etching chamber ranges from 2 mT to 20 mT, and a flow rate of a gas ranges from 10 sccm to 500 sccm.

In an embodiment, a gas for the reactive ion etching comprises one or more of: an inert gas, nitrogen, oxygen, a fluorine-based gas, an amine gas, carbon monoxide, carbon dioxide, and an alcohol gas.

Another method for controlling contaminants on a sidewall of a MTJ of a MRAM is further provided according to embodiments of the present disclosure. The method comprises: providing a base structure, where the base structure comprises a substrate, a lower electrode, a MTJ layer, and an upper electrode, which are arranged in the above-listed sequence along a first direction, and the first direction is perpendicular to the substrate and points from the substrate to the lower electrode; performing first etching on a surface of the upper electrode away from the substrate, until the lower electrode is exposed, where after the first etching, a portion of the MTJ layer close to the substrate tapers along the first direction, and a size of another portion of the MTJ layer is uniform along the first direction; performing second etching after the first etching, where after the second etching, a size of the whole the MTJ layer is uniform along the first direction, and a funnel-shaped trench is formed in the substrate and the lower electrode, the funnel-shaped trench comprises a first part in the lower electrode of the substrate and a second part in the substrate, the first part expands gradually along the first direction, and a size of the second part is uniform along the first direction; and removing metallic contaminants at a bottom of the funnel-shaped trench.

Embodiments of the present disclosure are advantageous over conventional technologies at least in following aspects.

The method for controlling the metallic contaminants on the side wall of the MTJ of the MRAM does not require depositing an additional insulating protective layer on the sidewall of the MTJ layer. Instead, the special funnel-shaped trench comprising the first part away from the bottom surface of the substrate and the second part close to the bottom surface of the substrate is formed through the etching. The first part expands gradually in size along the first direction, while the second part is uniform in size along the first direction. When the metallic contaminants are removed from the bottom of the funnel-shaped trench, the funnel-shaped trench is capable to shield the sidewall of the MTJ layer against adhesion of the metallic contaminants. Thereby, a performance of the MRAM in devices is improved.

BRIEF DESCRIPTION OF THE DRAWINGS

Hereinafter drawings to be applied in embodiments of the present disclosure or in conventional technology are briefly described, in order to clarify illustration of technical solutions according to embodiments of the present disclosure or in conventional technology. Apparently, the drawings in the following descriptions are only some embodiments of the present disclosure, and other drawings may be obtained by those skilled in the art based on the provided drawings without exerting creative efforts.

FIG. 7 is a schematic flowchart of a method for controlling contaminants on a sidewall of a MTJ of a MRAM according to an embodiment of the present disclosure.

FIG. 14 is a schematic diagram of a structure fabricated through a method for controlling contaminants on a sidewall of a MTJ of a MRAM according to another embodiment of the present disclosure.

FIG. 15 is a schematic flowchart of a method for controlling contaminants on a sidewall of a MTJ of a MRAM according to another embodiment of the present disclosure.

DETAILED DESCRIPTION OF EMBODIMENTS

Hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

Figure 1:
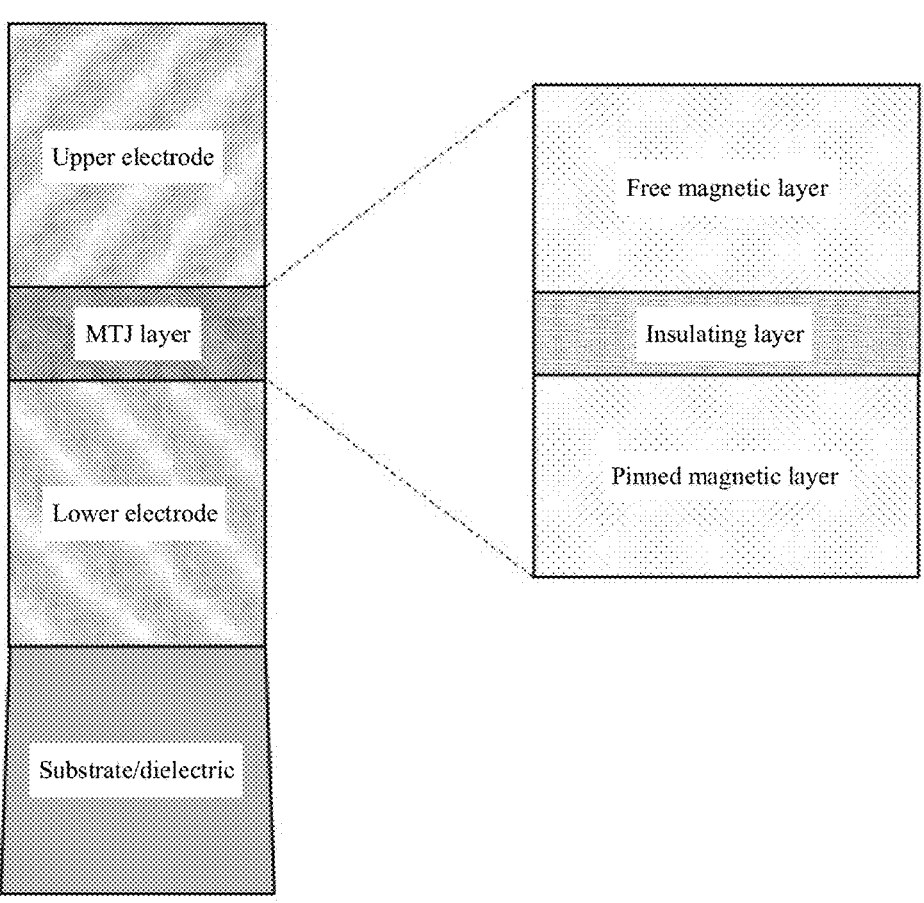
FIG. 1 is a schematic structural diagram of a single bin of a magnetic random access memory (MRAM).

Reference is made to FIG. 1 on a basis of content in the background. FIG. 1 is a schematic structural diagram of a single bin of a magnetic random access memory (MRAM). As shown in FIG. 1, an entire MRAM structure is disposed on a substrate, and there are a lower electrode, a magnetic tunnel junction (MTJ), and an upper electrode, which are arranged in the above-listed sequence along a certain direction. The MTJ is a key structure of a MRAM device. As shown in FIG. 1, the MTJ comprises a pinned magnetic layer, an insulating layer, and a free magnetic layer, which are arranged along such direction.

The direction is perpendicular to the substrate, and points from the substrate toward the lower electrode.

Figure 2:
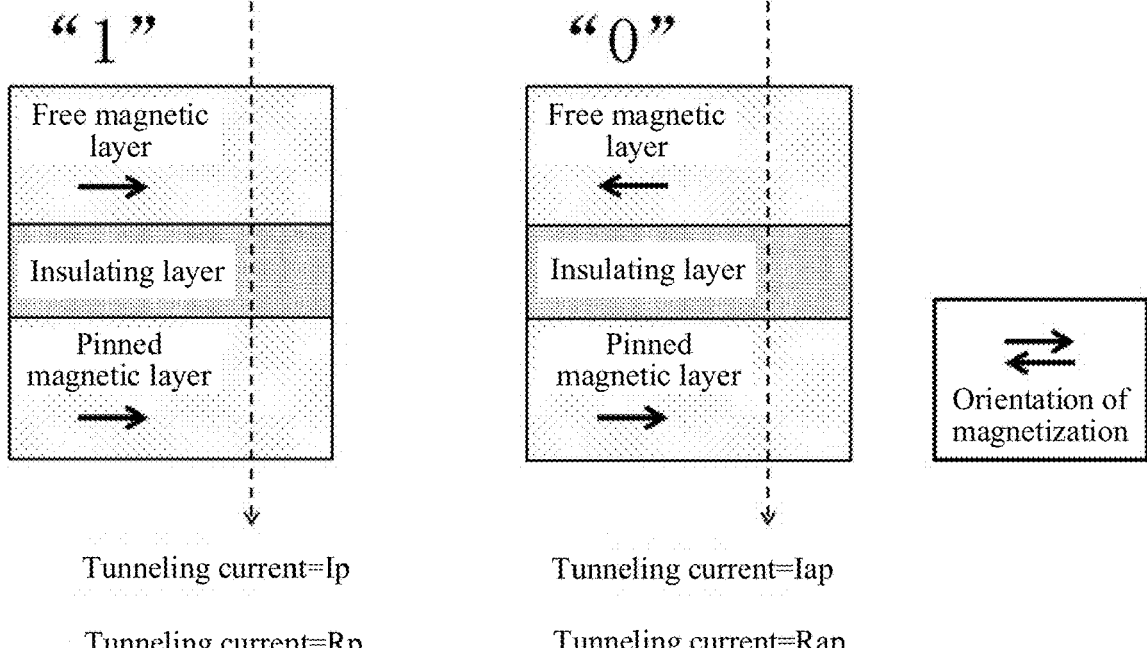
FIG. 2 is a schematic diagram of an operation principle of a magnetic tunnel junction (MTJ).

Reference is made to FIG. 2 on a basis of the MRAM structure as shown in FIG. 1. FIG. 2 is a schematic diagram of an operation principle of an MTJ. As shown in FIG. 2, when applying a voltage across the MTJ, a current is capable to pass through tunneling due to a quite small thickness (which is generally several nanometers) of the insulating layer. An orientation of magnetization in the pinned magnetic layer is fixed, and an orientation of magnetization in the free magnetic layer is switchable.

In a case that the orientation of magnetization of the pinned magnetic layer and that of the free magnetic layer are parallel, the resistance Rp of the MTJ is small, and a tunneling current Ip is large. In such case, the entire structure may be regarded as being in an on-state, which represents a bin of "1".

In a case that the orientation of magnetization of the pinned magnetic layer and that of the free magnetic layer are anti-parallel, the resistance Rap of the MTJ is large, and the tunneling current Iap is small. In such case, the entire structure may be regarded as being in an off-state, which represents a bin of "0".

A performance of the MTJ is calibrated by tunneling magnetoresistance (TMR), of which an equation is as follows:

$$TMR = \left( \frac{Rap - Rp}{Rp} \right)$$

The larger the TMR is, the better the performance of the MRAM is.

It is discovered from the equation the smaller resistance (Rp) of parallel magnetization is, or the greater resistance (Rap) of anti-parallel magnetization is, the larger a difference between the on-state current (Ip) and the off-state state current (Iap) is, and hence the better the performance is.

Figure 3:
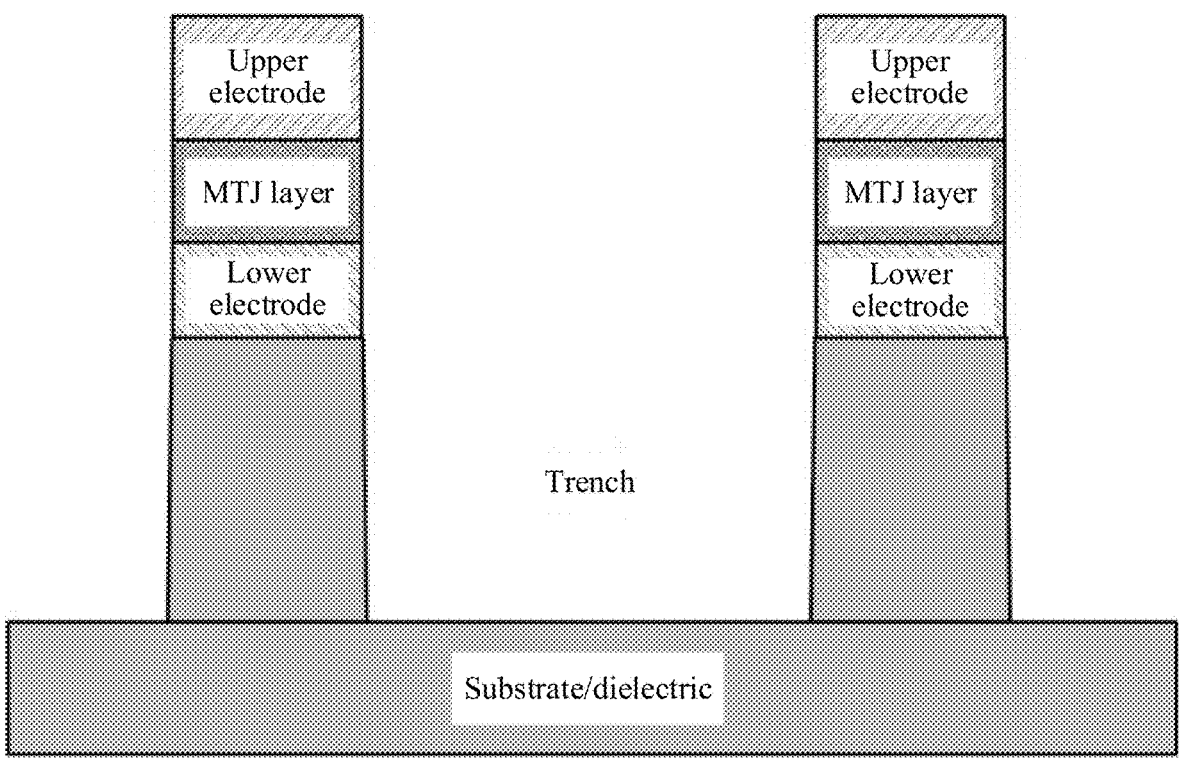
FIG. 3 is a schematic structural diagram of a single bin of another MRAM.

Reference is made to FIG. 3, which is a schematic structural diagram of a single bin of another MRAM. Multiple single-bin structures, as shown in FIG. 1, of the MRAM are arranged into an array and are interconnected via wiring, such that a simple MRAM storage structure as shown in FIG. 3 is formed.

As shown in FIG. 3, a trench is formed between different single-bin structures of MRAM. The trench may be regards as a part of an MTJ structure in the MRAM.

Generally, ion beam etching or reactive ion etching is performed during manufacture of the MRAM. A main material of the MRAM is metallic, and hence metallic contaminants, which are non-volatile by-products of the etching, would be formed during the etching. It is inevitable that some metallic contaminants would fall into the trench, and hence forms a layer of contaminants in the trench.

A cleaning process is required after the etching, so as to remove the metallic contaminants in the trench.

Figure 4:
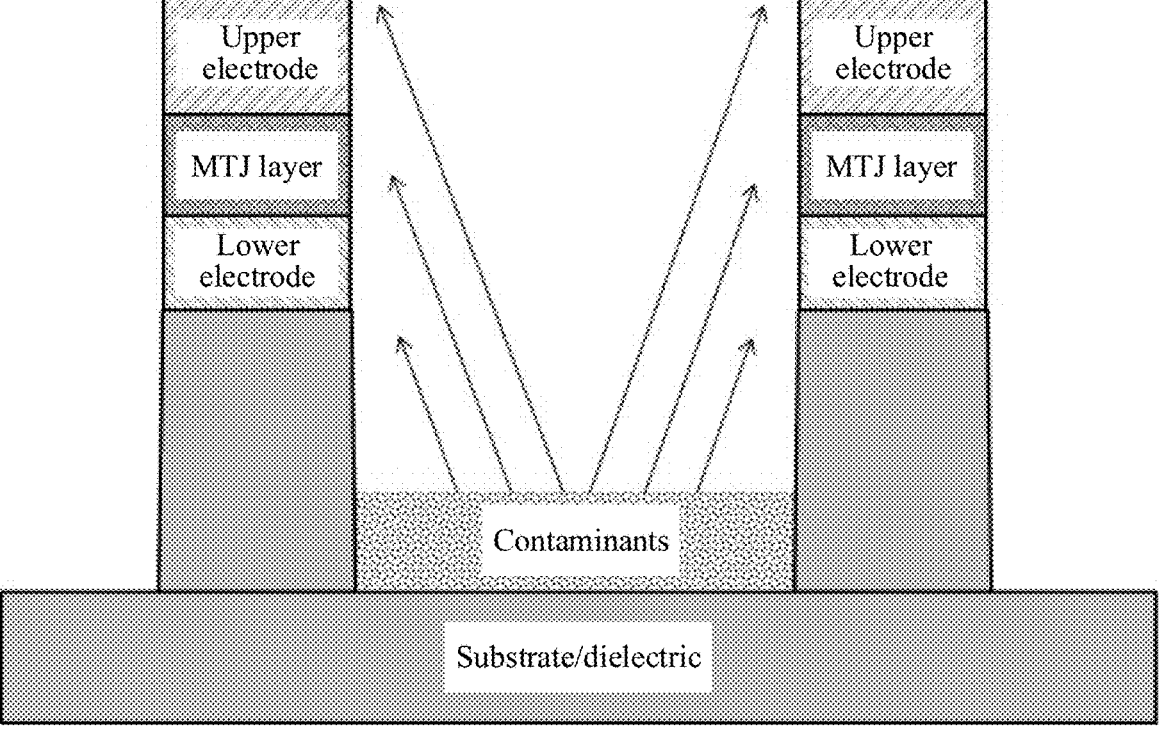
FIG. 4 is a schematic diagram of a process of cleaning a trench of a MRAM to remove metallic contaminants.

Reference is made to FIG. 4, which is a schematic diagram of a process of cleaning the trench of the MRAM to remove the metallic contaminants. Generally, the cleaning is a process of etching under low power, in which a bottom of the trench is bombarded to sputter the metallic contaminants out of the trench.

Figure 5:
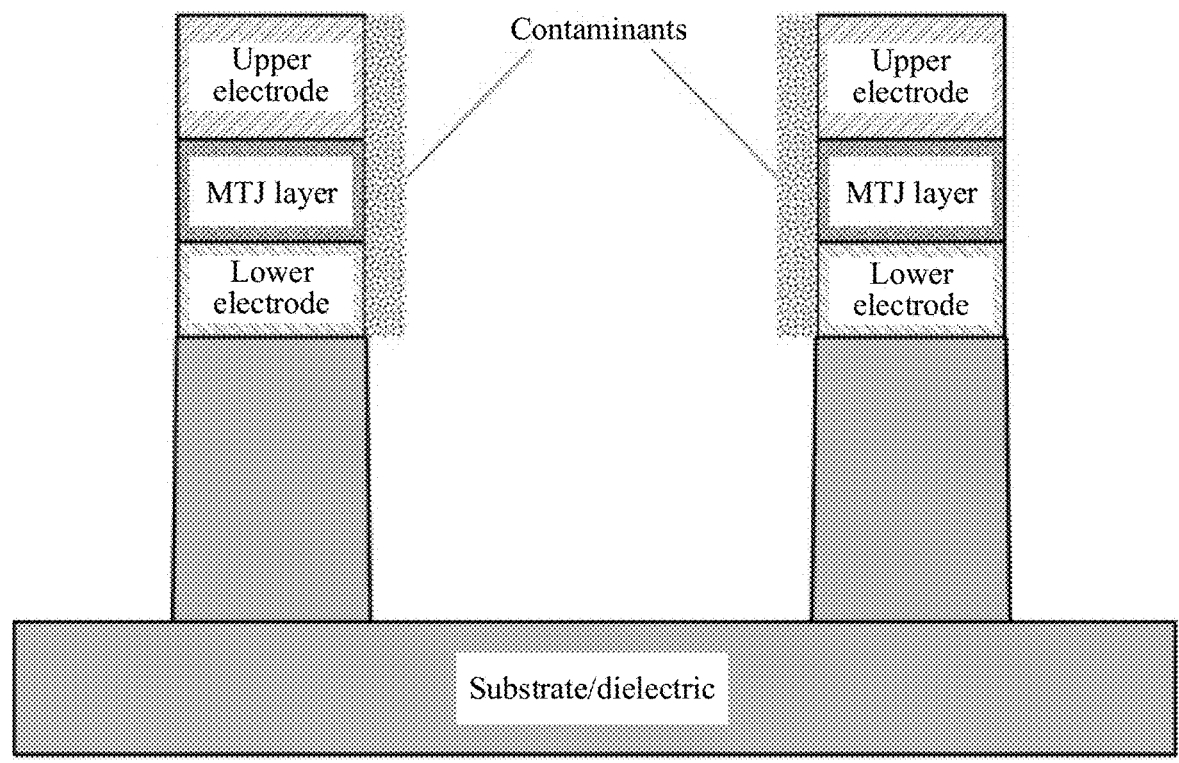
FIG. 5 is a schematic diagram of a structure after cleaning a trench of a MRAM to remove metallic contaminants.

Reference is made to FIG. 5, which is a schematic diagram of a structure after the trench of a MRAM is cleaned to remove the metallic contaminants. As shown in FIG. 5, after the cleaning, some metallic contaminants adhere to the MRAM structure, especially to the sidewall(s) of the MTJ (s).

Figure 6:
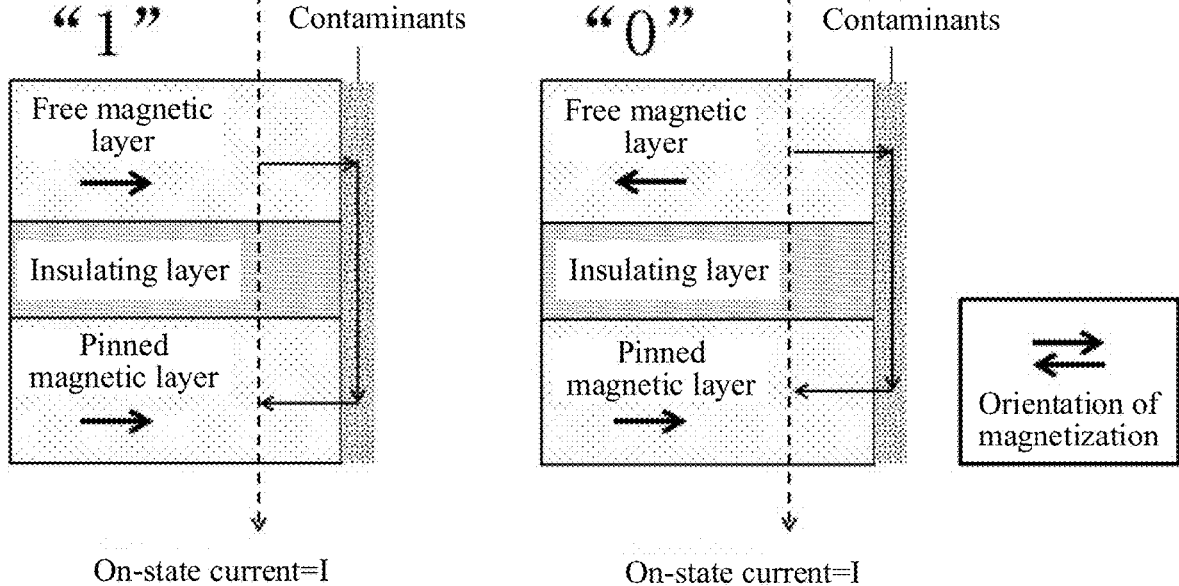
FIG. 6 is a schematic diagram of a characteristic of a MRAM to which metallic contaminants are adhered.

Reference is made to FIG. 6, which is a schematic diagram of a characteristic of the MRAM to which with metallic contaminants adhere. As shown in FIG. 6, when there are metallic contaminants adhering to the sidewall of the MTJ layer, a current passing the MTJ layer need not tunnel through the insulating layer, but may directly flow through the metallic contaminants on the sidewall and become an on-state current (I). In such case, there is no difference between the current of parallel magnetization and the current of the anti-parallel magnetization, that is, Ip=Iap=I, regardless orientation of magnetization in the pinned magnetic layer and the free magnetic layer. Thereby, TMR is equal to 0, which indicates a failure of the MRAM.

In conventional technology, an insulating protective layer is coated on the sidewall of the MTJ layer, so as to prevent the MTJ layer from being bypassed by the metallic contaminants on the sidewall and thereby address the above issue.

In such solution, the MRAM needs to be transferred among various devices when being manufacture. The inventor discovers that that a yield is rather limited and a critical dimension (CD) of a MRAM-based structure is difficult to control.

A method for controlling contaminants on a sidewall of a MTJ of a MRAM is provided according to embodiments of the present disclosure. The metallic contaminants on the MTJ of the MRAM can be removed to a great extent while not affecting a performance of the MRAM.

Hereinafter the present disclosure would be described in detail below in conjunction with the drawings and specific embodiments, in order to clarify and elucidate the above objects, features and advantages of the present disclosure.

Reference is made to FIG. 7, which is a schematic flowchart of a method for controlling contaminants on a sidewall of a MTJ of a MRAM according to an embodiment of the present disclosure.

The method comprises following steps S101 to S104.

Figure 8:
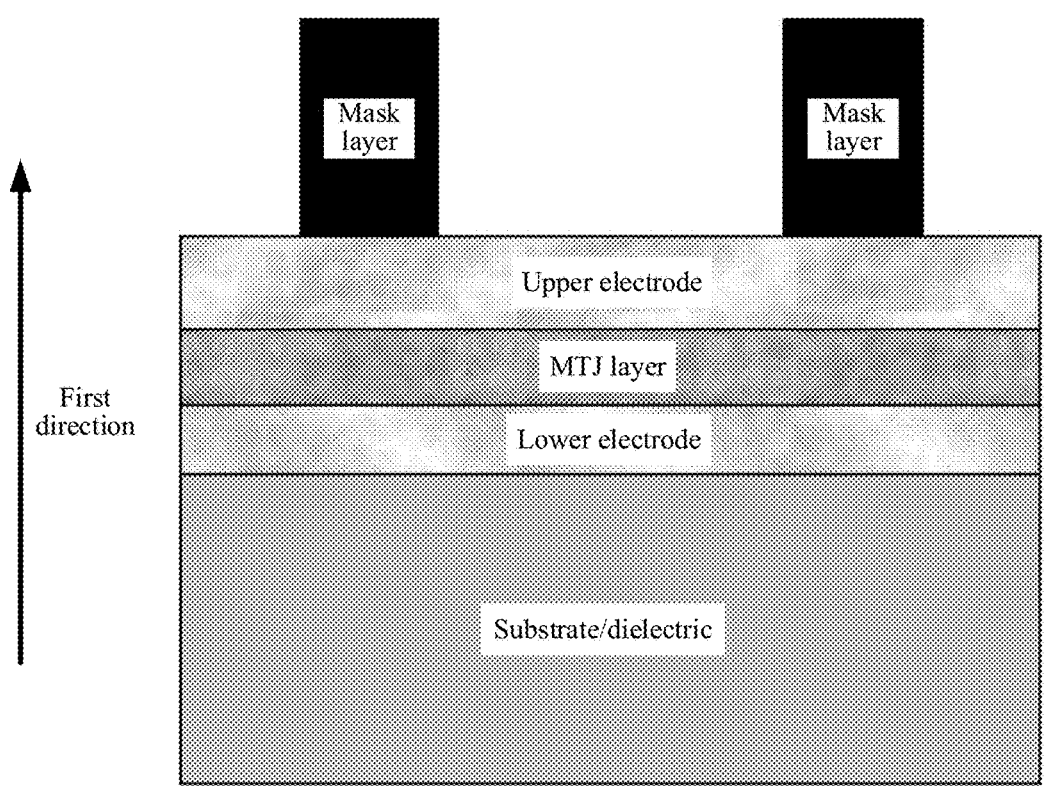
FIGS. 8 to 12 are schematic structural diagrams corresponding to a method as shown in FIG. 7 according to an embodiment of the present disclosure.

In step 101, a base structure is provided, as shown FIG. 8. The base structure comprises a substrate, a lower electrode, a magnetic tunnel junction (MTJ) layer, and an upper electrode, which are arranged in the above-listed sequence along a first direction. The first direction is perpendicular to the substrate and points from the substrate to the lower electrode.

Figure 9:
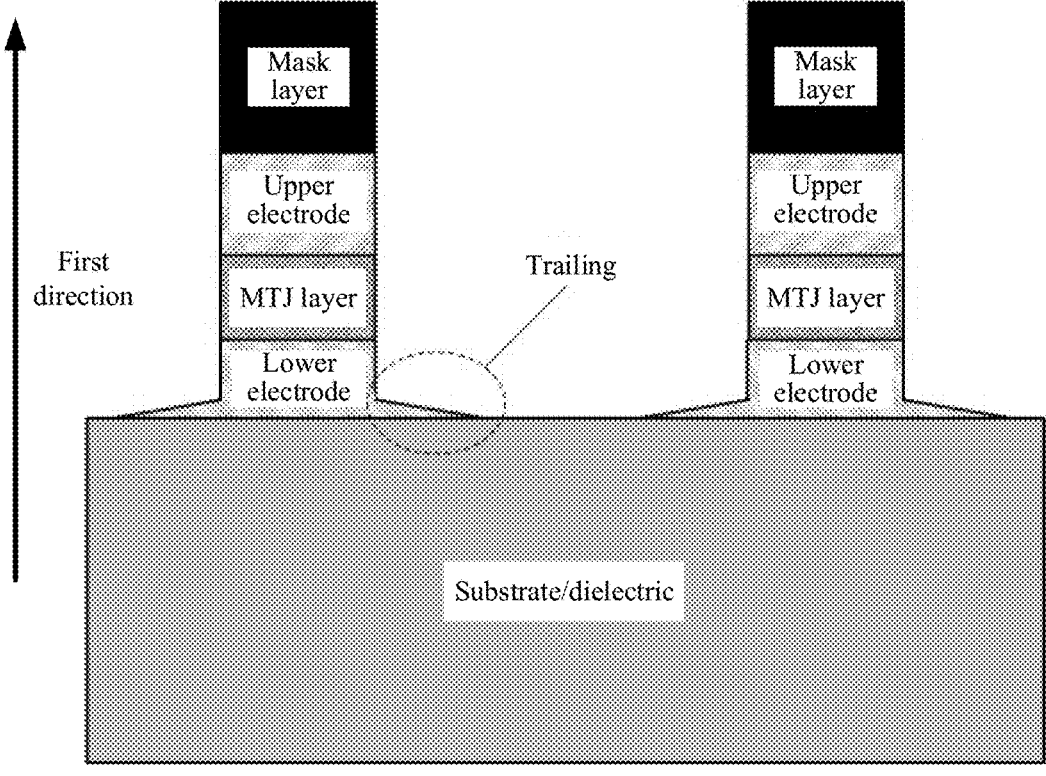

In step S102, first etching is performed on a surface of the upper electrode away from the substrate, until the substrate is exposed, as shown in FIG. 9. After the first etching, a portion of the lower electrode adjacent to the substrate tapers along the first direction, and a size of another portion of the lower electrode is uniform along the first direction.

In this step, a size of the part of the lower electrode adjacent to the substrate shrinks gradually along the first direction, and the size of the other part of the lower electrode keeps constant along the first direction. That is, a "trailing" structure is formed as shown in FIG. 9.

Figure 10:
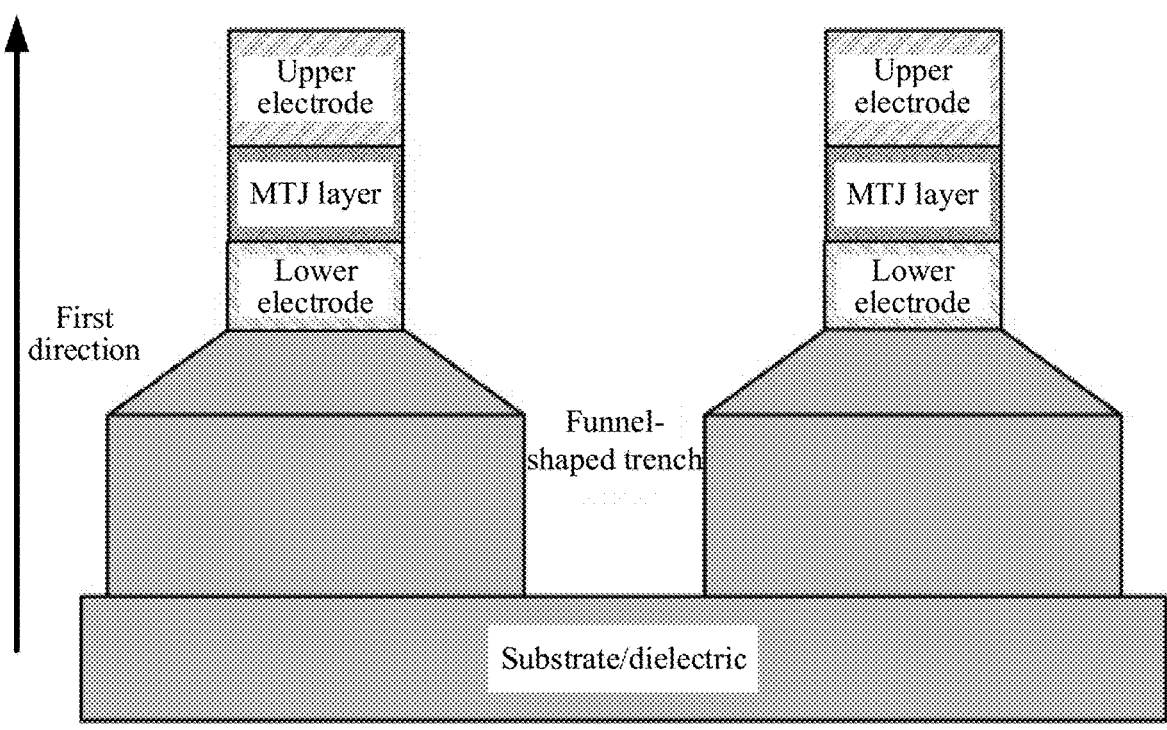

In S103, second etching is performed subsequent to the first etching, as shown in FIG. 10. After the second etching, a size of the whole lower electrode is uniform along the first direction, and a funnel-shaped trench is formed in the substrate. The funnel-shaped trench comprises a first part away from a bottom surface of the substrate and a second part close to the bottom surface of the substrate. The first part expands gradually along the first direction, and a size of the second part is uniform along the first direction.

In this step, the "trailing" structure as formed in step S102 is capable to serve a mask in step S103. The second etching is implemented through such mask and hence forms a trench having a shape of a funnel. That is, the funnel-shaped trench is formed.

Figure 11:
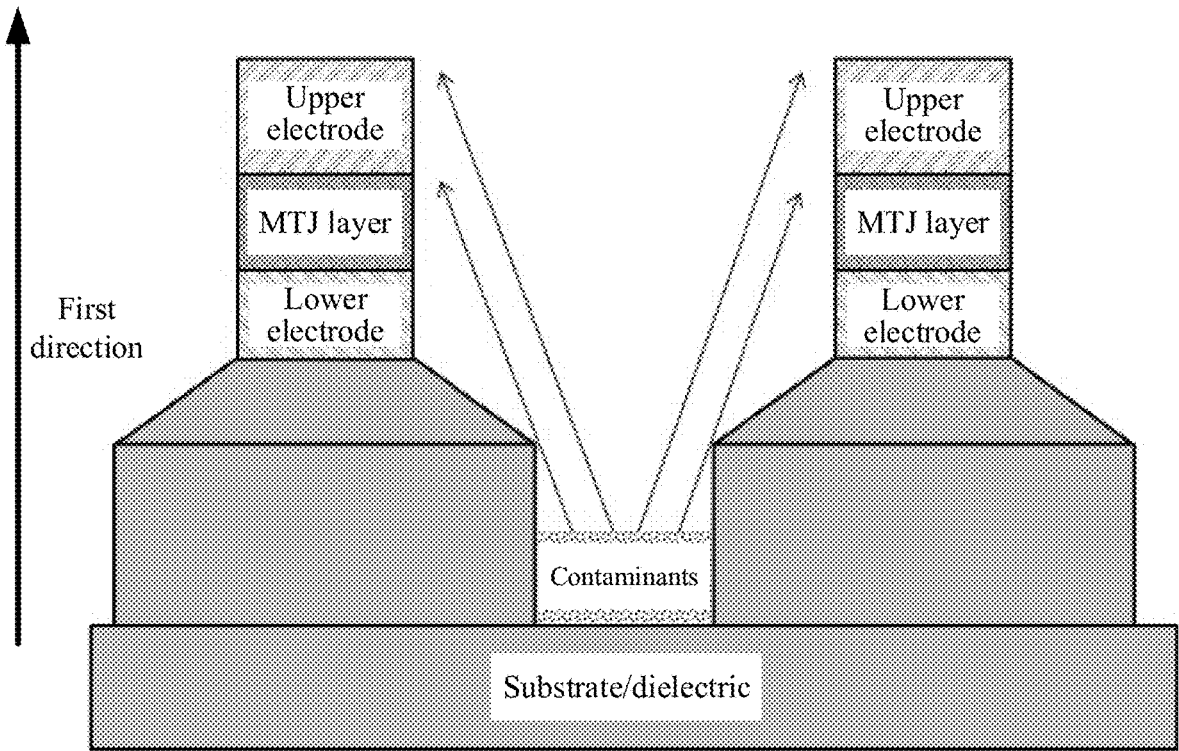

In step S104, metallic contaminants at a bottom of the funnel-shaped trench are removed, as shown in FIG. 11.

Figure 12:
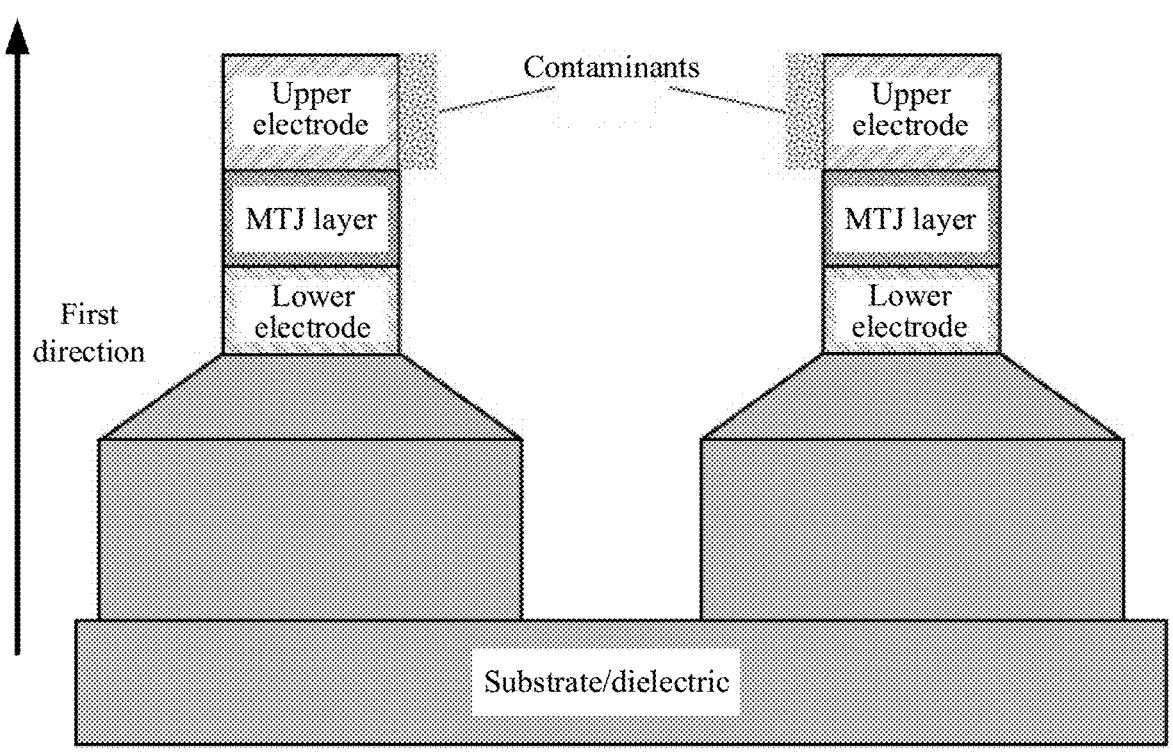

The foregoing method does not require forming an additional insulating protective layer on the sidewall of the MTJ layer. Instead, the special funnel-shaped trench comprising the first part away from the bottom surface of the substrate and the second part close to the bottom surface of the substrate is formed through the etching. The first part expands gradually in size along the first direction, while the second part is uniform in size along the first direction. As shown in FIG. 11 and FIG. 12, when the metallic contaminants are removed from the bottom of the funnel-shaped trench, a protruding at a junction between the first part and the second part of the funnel-shaped trench blocks a path along which some sputtered metallic contaminants travel. Most of the metallic contaminants would at best adhere to a sidewall of the upper electrode, but not to the sidewall of the MTJ layer. Thus, no current path is formed on the sidewall of the MTJ layer, which improves the performance of the MRAM.

Figure 13:
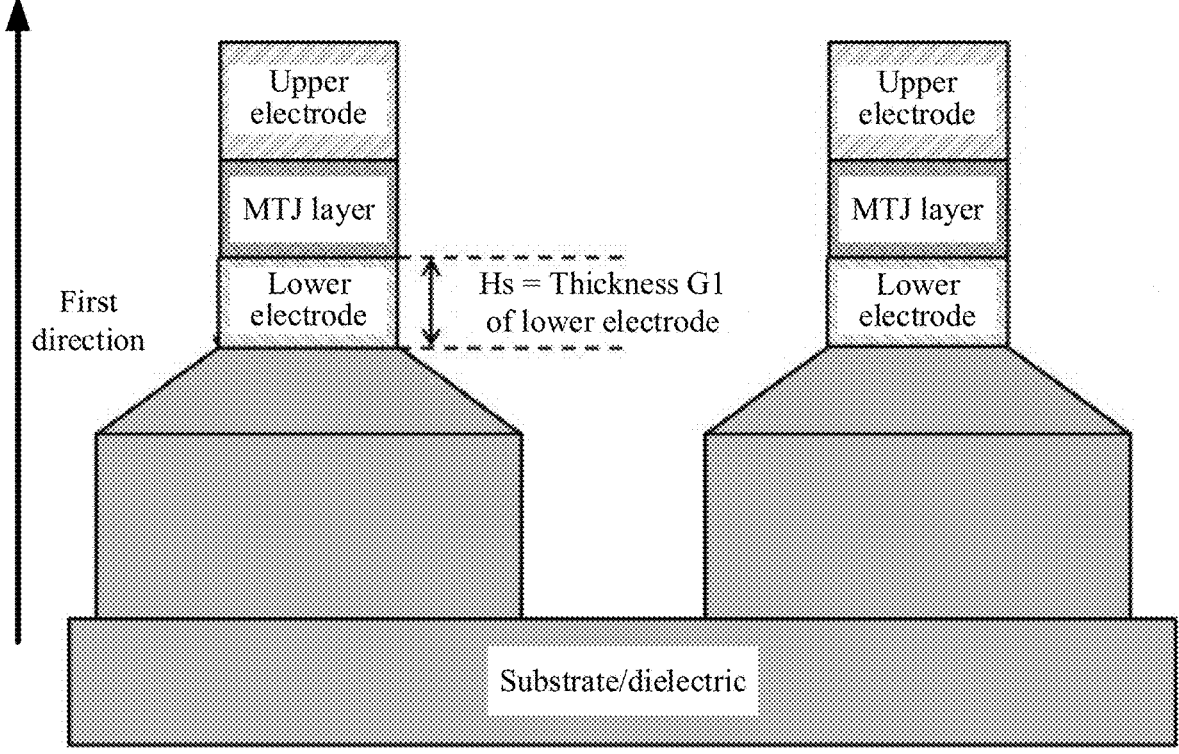
FIG. 13 is a schematic diagram of a structure fabricated through a method for controlling contaminants on a sidewall of a MTJ of a MRAM according to an embodiment of the present disclosure.

Reference is made to FIG. 13, which is a schematic diagram of a structure formed through a method for controlling contaminants on a sidewall of a MTJ of a MRAM according to an embodiment of the present disclosure. Reference is made to FIG. 14, which is a schematic diagram of a structure formed through a method for controlling contaminants on a sidewall of a MTJ of a MRAM according to another embodiment of the present disclosure.

Hs represents a distance between a surface of the MTJ layer away from the upper electrode and a surface of the first part away from the second part, and G1 represents a thickness of the lower electrode along the first direction. Hs is greater than or equal to G1.

Herein relative amplitude between Hs and G1 may affect an effect of blocking the path of the sputtered metallic contaminants. As a comparative result, a case of Hs=G1 is better that a case of Hs>G1 in the blocking effect.

As shown in FIG. 14, the case of Hs>G1 refers to that after the second etching, the sizes of the whole lower electrode is uniform along the first direction, and a size of a part of the substrate adjacent to the lower electrode is also uniform along the first direction, while the funnel-shaped trench is located in another part of the substrate. The funnel-shaped trench comprises the first part away from the bottom surface of the substrate and the second part close to the bottom surface of the substrate. The first part expands in size gradually along the first direction, while the second part keeps constant in size along the first direction.

Reference is made to FIG. 15, which is a schematic flowchart of a method for controlling contaminants on a sidewall of MTJ of a MRAM according to another embodiment of the present disclosure.

Before performing the first etching, the method further comprises step S105.

In step S105, a mask layer is formed on the surface of the upper electrode away from the substrate, as shown in FIG. 8. The mask layer comprises multiple mask units.

In an embodiment, the mask layer is provided on the base structure, that is, on the surface of the upper electrode away from the MTJ layer. A material of the mask layer may comprise one or more of: TiN, Ta, C, Si, SiO, and SiN, which may depend on an actual situation and is not limited herein.

In an embodiment, performing the first etching comprises a following step. The first etching is performed on the surface of the upper electrode away from the substrate through ion beam etching, until the substrate is exposed. After the first etching, the portion of the lower electrode adjacent to the substrate tapers along the first direction, and the size of another portion of the lower electrode is uniform along the first direction.

That is, a means of the first etching is the ion beam etching (IBE). Parameters of the IBE are as follows. Energy of ions ranges from 50 V to 600 V. A voltage for accelerating the ions ranges from 50 V to 1000 V. A flow rate of a gas ranges from 10 sccm to 500 sccm.

The gas comprises one or more of: an inert gas, nitrogen, oxygen, a fluorine-based gas, an amine gas, carbon monoxide, carbon dioxide, and an alcohol gas.

A degree of the first etching needs to be determined according to an actual situation, as long as it is ensured that the first etching stops at an interface between the lower electrode and the substrate.

As shown in FIG. 9, a shielding effect in the IBE leads to a "trailing" structure formed in the lower electrode after the first etching.

Figure 16:
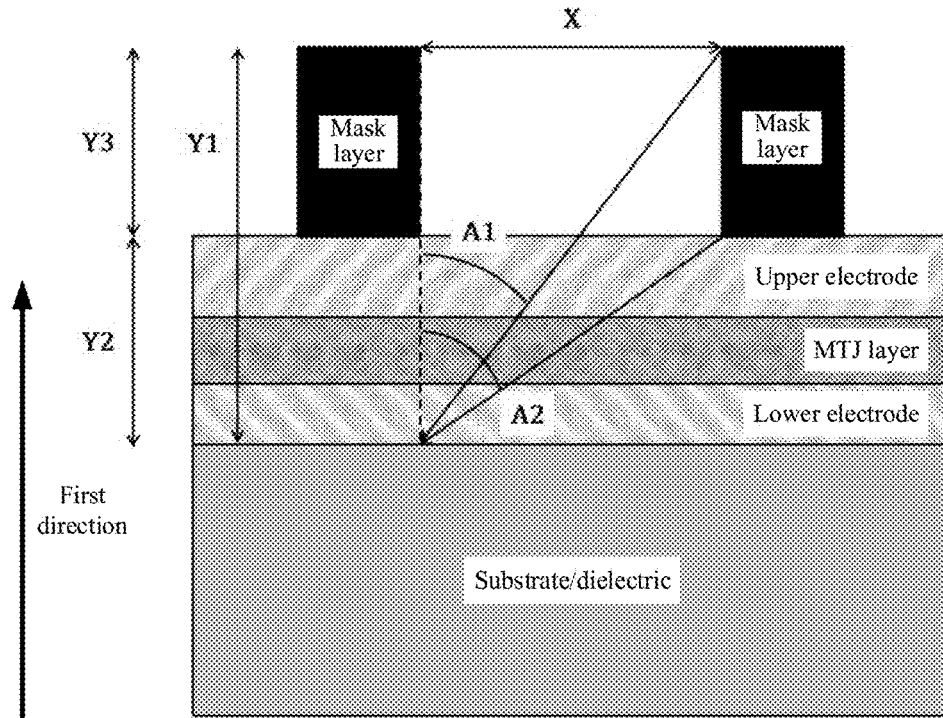
FIG. 16 is a schematic diagram of a structure to be processed by a method for controlling contaminants on a sidewall of a MTJ of a MRAM according to an embodiment of the present disclosure.

Reference is made to FIG. 16, which is a schematic diagram of a structure to be processed by a method for controlling contaminants on a sidewall of a MTJ of a MRAM according to an embodiment of the present disclosure.

X represents a distance between two adjacent mask units, Y3 represents a thickness of each mask unit along the first direction, Y2 represents a total thickness of the lower electrode, the MTJ layer, and the upper electrode along the first direction, and Y1 represents a total thickness of the mask unit, the lower electrode, the MTJ layer, and the upper electrode along the first direction. There is Y1=Y2+Y3. A first angle is defined as $$A1 = \arctan\left(\frac{X}{Y1}\right),$$

a second angle is defined as $$A2 = \arctan\left(\frac{X}{Y2}\right),$$

and a third angle A3 meets that 0<A3−A2≤5°. In the above IBE, an incident angle of an ion beam may be greater than A1 and less than A3.

Figure 17:
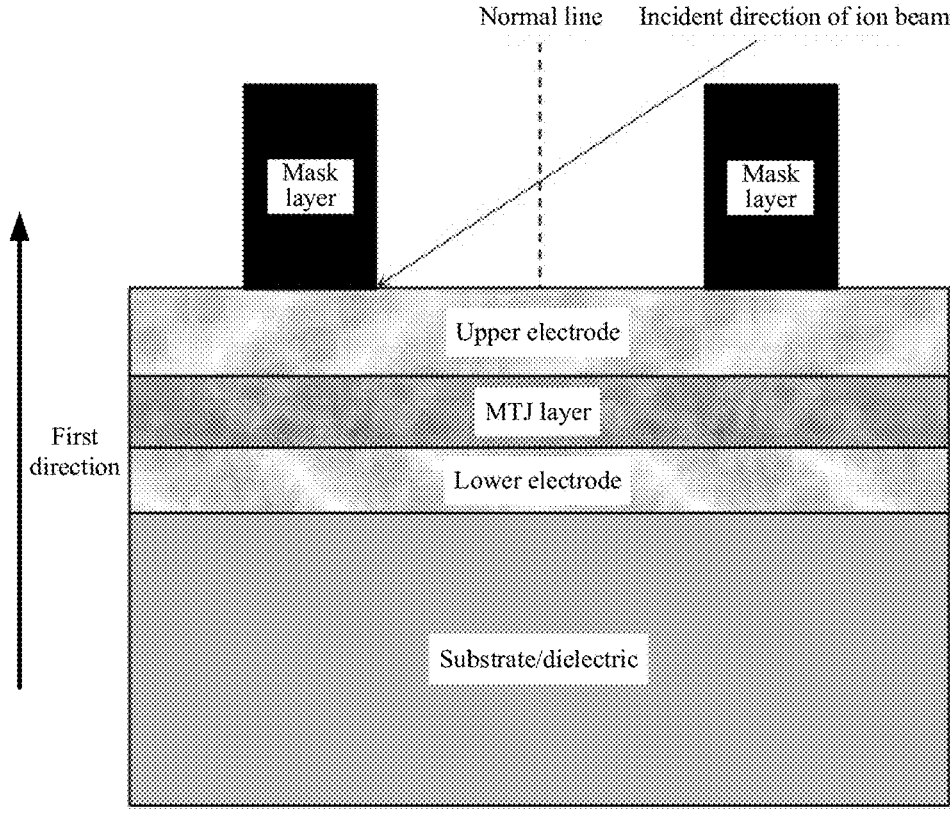
FIG. 17 is a schematic diagram of a structure to be processed by a method for controlling contaminants on a sidewall of a MTJ of a MRAM according to another embodiment of the present disclosure.

Reference is made to FIG. 17, which is a schematic diagram of a structure to be processed by a method for controlling contaminants on a sidewall of a MTJ of a MRAM according to another embodiment of the present disclosure. The incident angle of the ion beam is defined as an angle between an incident direction of the ion beam and a normal line, or an angle between the incident direction of the ion beam and the first direction.

Although a large incident angle in the IBE etching can effectively ensure that the metallic contaminants do not adhere to the sidewall of the MTJ layer, an excessively large incident angle renders the critical dimension of devices too small and a performance of the devices poor. In a case that the incident angle is too small, the funnel-shaped trench cannot be formed, and the metallic contaminants would adhere to the sidewall of the MTJ layer. Hence, the incident angle of the ion beam is greater than A1 and less than A3 in this embodiment. The sidewall of the MTJ layer is guaranteed to be free of the metallic contaminants to the most extent, while ensuring the performance of the MRAM.

In an embodiment, performing the second etching comprises a following step. The second etching is performed through reactive ion etching. After the second etching, the size of at least the whole lower electrode is uniform along the first direction, and the funnel-shaped trench is formed in the substrate. The funnel-shaped trench comprises the first part away from the bottom surface of the substrate and the second part close to the bottom surface of the substrate. The first part expands gradually in size along the first direction, and the second part keeps constant in size along the first direction.

In other words, a means of the second etching is the reactive ion etching (RIE).

In the RIE, a value of a direct-current (DC) bias voltage is less than or equal to a value of the energy of the ions in the IBE.

In the RIE, a selectivity ratio of dielectric etching and metal etching is greater than 1.5.

In the RIE, a thickness of a removed part of the substrate is greater than 10 nm.

In the RIE, power of a source electrode ranges from 100 W to 1000 W, power of a bias electrode ranges from 100 W to 1500 W, pressure in an etching chamber ranges from 2 mT to 20 mT, and a flow rate of a gas ranges from 10 sccm-500 sccm.

In the RIE, the gas comprises one or more of: an inert gas, nitrogen, oxygen, a fluorine-based gas, an amine gas, carbon monoxide, carbon dioxide, and an alcohol gas.

As shown in FIG. 10, the "trailing" structure formed through the IBE is capable to serve a mask during the RIE. The RIE is implemented through the mask to form the trench having the shape of a funnel. That is, the funnel-shaped trench is formed.

A low loading effect of the RIE may compensate a loading effect in the IBE to some extent.

The inventor has discovered that in the RIE, an increased degree of etching the removed substrate accompanies a stronger cleaning effect on the metallic contaminants at the bottom of the funnel-shaped trench and a more obscured protrusion at the junction between the first part and the second part of the funnel-shaped trench. Hence, more metallic contaminants adhere to the sidewall of the MTJ layer.

Therefore, insufficient RIE may result in excessive metallic contaminants at the bottom of the funnel-shaped trench, which electrically connects two MRAM bins, while excessive RIE may result in excessive metallic contaminants on the sidewall of the MTJ layer, which causes a failure of a single MRAM bin. Thereby, the RIE parameters are controlled as described above.

Figure 18:
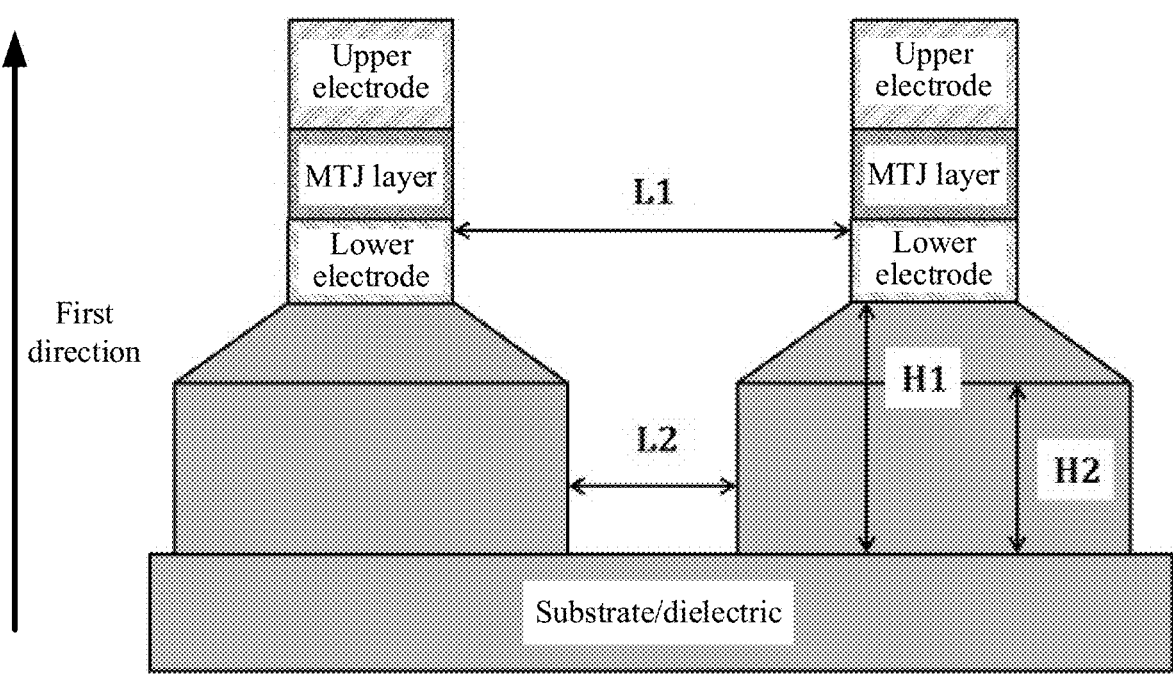
FIG. 18 is a schematic diagram of a structure fabricated through a method for controlling contaminants on a sidewall of a MTJ of a MRAM according to another embodiment of the present disclosure.

Reference is made to FIG. 18, which is a schematic diagram of a structure fabricated through a method for controlling contaminants on a sidewall of a MTJ of a MRAM according to an embodiment of the present disclosure.

As shown in FIG. 18, a width of the bottom of the funnel-shaped trench is L2, a width between two adjacent lower electrodes is L1, a total thickness of the first part and the second part of the funnel-shaped trench along the first direction is H1, and a thickness of the second part of the funnel-shaped trench along the first direction is H2. In this embodiment, L1 is greater than L2, and H1 is greater than H2.

Hereafter processes under different processing parameters are taken as examples for illustration.

First Example

In the IBE, the incident angle of the ion beam angle is 45°, the energy of ions is 200 V, the voltage for accelerating the ions is 200 V, the pressure in the etching chamber is 2 mT, the flow rate of the gas is 100 sccm, the gas is argon, and the etching stops at the interface between the substrate and the lower electrode.

In the RIE, the power of the source electrode is 200 W, the power of the bias electrode is 100 W, the pressure in the etching chamber is 10 mT, the flow rate of the gas is 200 sccm, the gas is argon, and the etching stops at a depth of 30 nm into the substrate.

Figure 19:
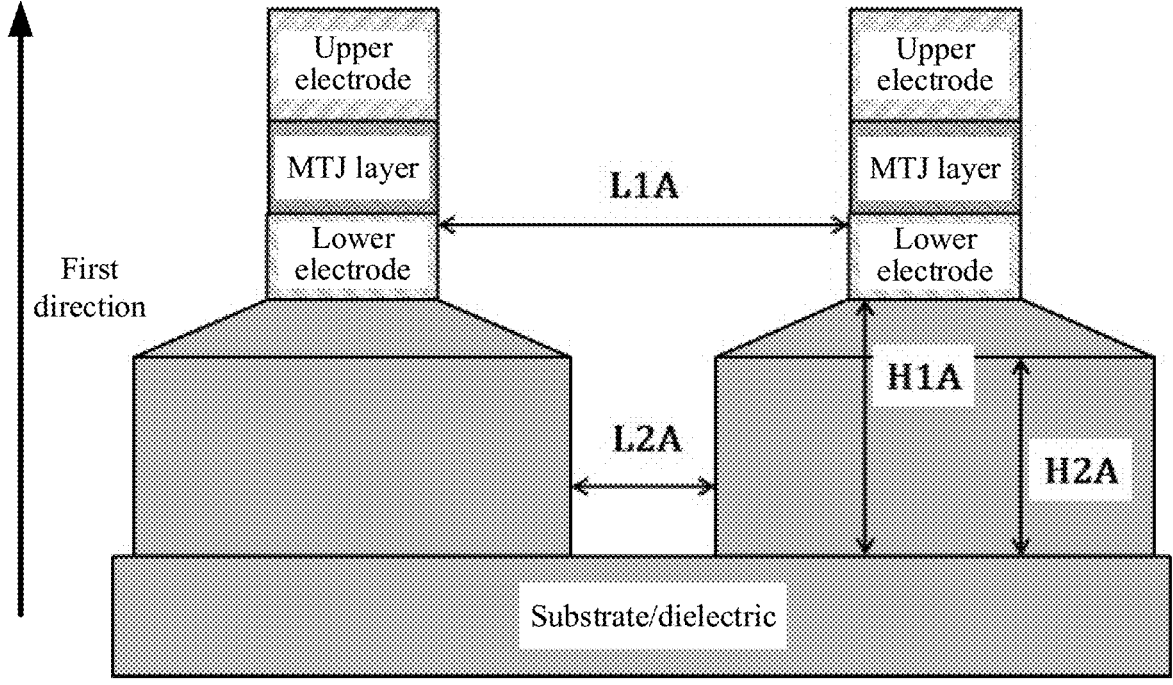
FIG. 19 is a schematic diagram of a structure fabricated through a method for controlling contaminants on a sidewall of a MTJ of a MRAM according to another embodiment of the present disclosure.

Reference is made to FIG. 19, which is a schematic diagram of a structure fabricated through a method for controlling contaminants on a sidewall of a MTJ of a MRAM according to another embodiment of the present disclosure. Using the foregoing processing parameters, the width of the bottom of the funnel-shaped trench is equal to L2A, the width between two adjacent lower electrodes is equal to L1A, the total thickness of the first part and the second part of the funnel-shaped trench along the first direction is equal to H1A, and the thickness of the second part of the funnel-shaped trench along the first direction is equal to H2A.

A result of actual test shows that no metallic contaminant is on the sidewall of the upper electrode and the sidewall of the MTJ layer after the foregoing step of removing the metallic contaminants.

Second Example

In the IBE, the incident angle of the ion beam angle is 45°, the energy of ions is 200 V, the voltage for accelerating the ions is 200 V, the pressure in the etching chamber is 2 mT, the flow rate of the gas is 100 sccm, the gas is argon, and the etching stops at the interface between the substrate and the lower electrode.

In the RIE, the power of the source electrode is 200 W, the power of the bias electrode is 200 W, the pressure in the etching chamber is 10 mT, the flow rate of the gas is 200 sccm, the gas is argon, and the etching stops at a depth of 30 nm into the substrate.

Figure 20:
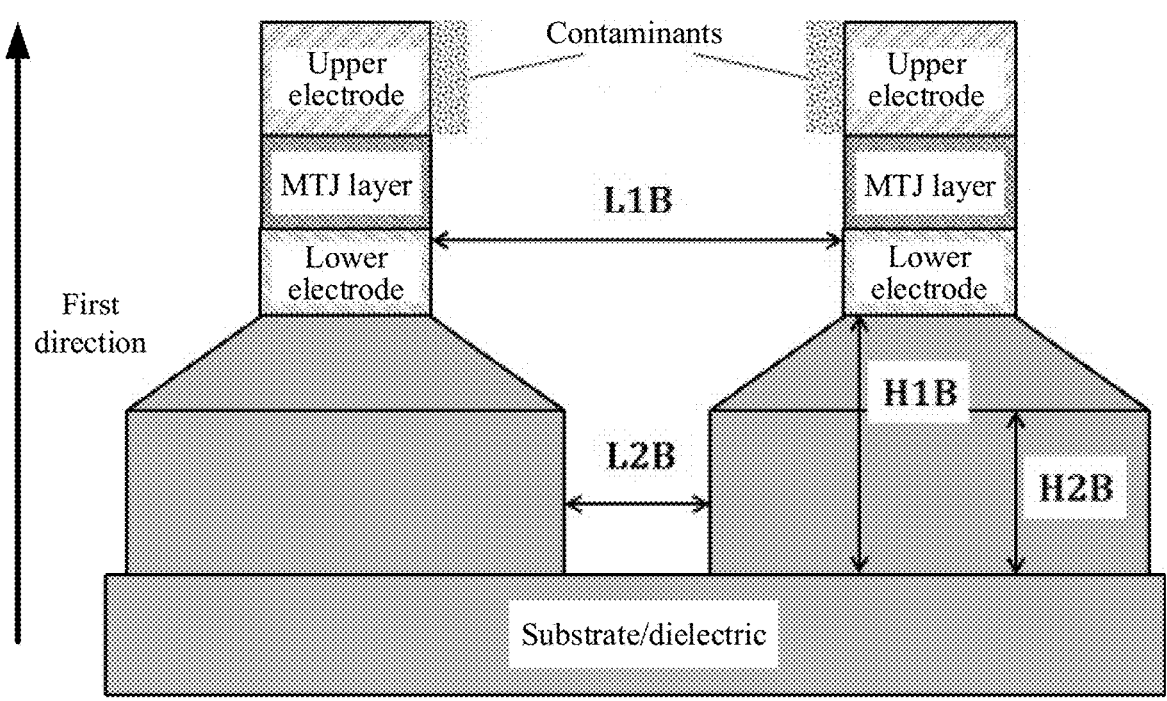
FIG. 20 is a schematic diagram of a structure fabricated through a method for controlling contaminants on a sidewall of a MTJ of a MRAM according to another embodiment of the present disclosure.

Reference is made to FIG. 20, which is a schematic diagram of a structure fabricated through a method for controlling contaminants on a sidewall of a MTJ of a MRAM according to another embodiment of the present disclosure. Using the foregoing processing parameters, the width of the bottom of the funnel-shaped trench is equal to L2B, the width between two adjacent lower electrodes is equal to L1B, the total thickness of the first part and the second part of the funnel-shaped trench along the first direction is equal to H1B, and the thickness of the second part of the funnel-shaped trench along the first direction is equal to H2B.

Compared with the structure as shown in FIG. 19, there are L1B=L1A, L2B=L2A, H1B=H1A, and H2B<H2A.

That is, compared with the structure in the first example, the protrusion at the junction between the first part and the second part in the funnel-shaped trench is lowered, and thus the blocking effect on the path of the sputtered metallic contaminants is weakened.

A result of actual test shows that there are metallic contaminants on the sidewall of the upper electrode while there is no metallic contaminant on the sidewall of the MTJ layer after the foregoing step of removing the metallic contaminants.

Third Example

In the IBE, the incident angle of the ion beam angle is 35°, the energy of ions is 200 V, the voltage for accelerating the ions is 200 V, the pressure in the etching chamber is 2 mT, the flow rate of the gas is 100 sccm, the gas is argon, and the etching stops at the interface between the substrate and the lower electrode.

In the RIE, the power of the source electrode is 200 W, the power of the bias electrode is 200 W, the pressure in the etching chamber is 10 mT, the flow rate of the gas is 200 sccm, the gas is argon, and the etching stops at a depth of 30 nm into the substrate.

Figure 21:
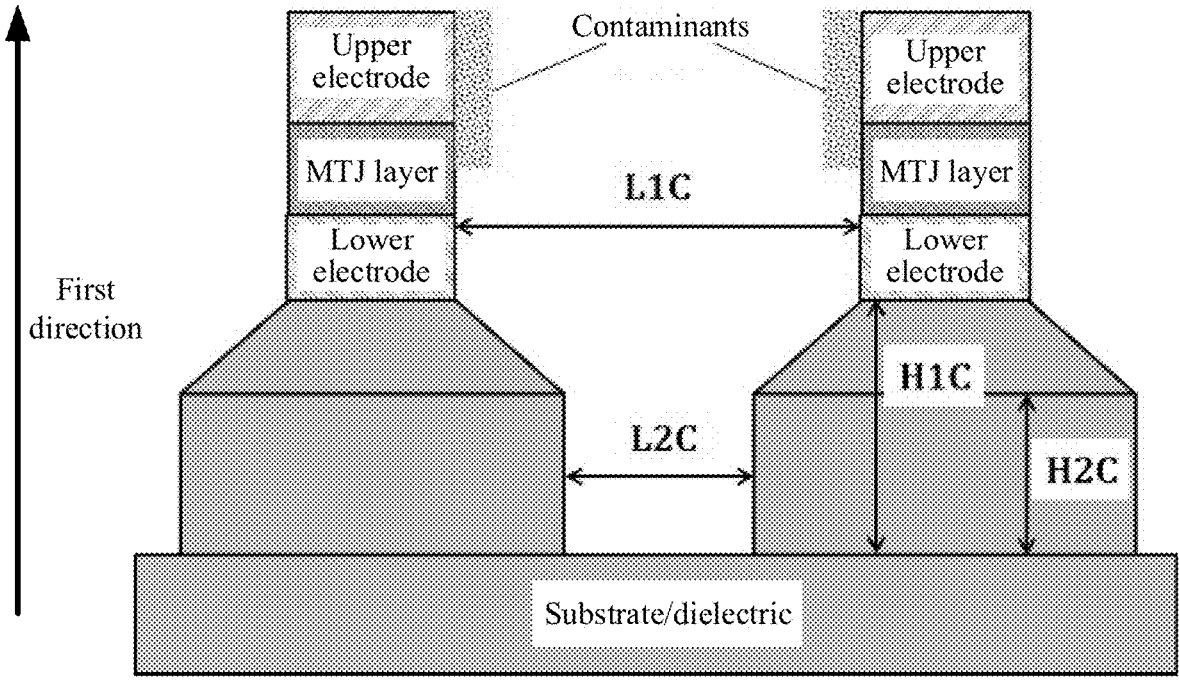
FIG. 21 is a schematic diagram of a structure fabricated through a method for controlling contaminants on a sidewall of a MTJ of a MRAM according to another embodiment of the present disclosure.

Reference is made to FIG. 21, which is a schematic diagram of a structure fabricated through a method for controlling contaminants on a sidewall of a MTJ of a MRAM according to another embodiment of the present disclosure. Using the foregoing processing parameters, the width of the bottom of the funnel-shaped trench is equal to L2C, the width between two adjacent lower electrodes is equal to L1C, the total thickness of the first part and the second part of the funnel-shaped trench along the first direction is equal to H1C, and the thickness of the second part of the funnel-shaped trench along the first direction is equal to H2C.

Compared with the structure as shown in FIG. 20, there are L1B=L1C, L2C<L2B, H1B=H1C, and H2B=H2C.

That is, compared with the structure in the second example, the width of the bottom of the funnel-shaped trench is increased, and thereby the blocking effect on the path of the sputtered metallic contaminants is further weakened.

A result of actual test shows that after the foregoing step of removing the metallic contaminants, there are metallic contaminants on the sidewall of the upper electrode and on an upper portion of the sidewall of the MTJ layer, while the metallic contaminants does not cover the sidewall of the MTJ layer entirely to connect the upper electrode and lower electrode electrically. In such case, the device does not fail.

Fourth Example

In the IBE, the incident angle of the ion beam angle is 45°, the energy of ions is 200 V, the voltage for accelerating the ions is 200 V, the pressure in the etching chamber is 2 mT, the flow rate of the gas is 100 sccm, the gas is argon, and the etching stops at the interface between the substrate and the lower electrode.

In the RIE, the power of the source electrode is 600 W, the power of the bias electrode is 600 W, the pressure in the etching chamber is 10 mT, the flow rate of the gas is 200 sccm, the gas is argon, and the etching stops at a depth of 30 nm into the substrate.

Figure 22:
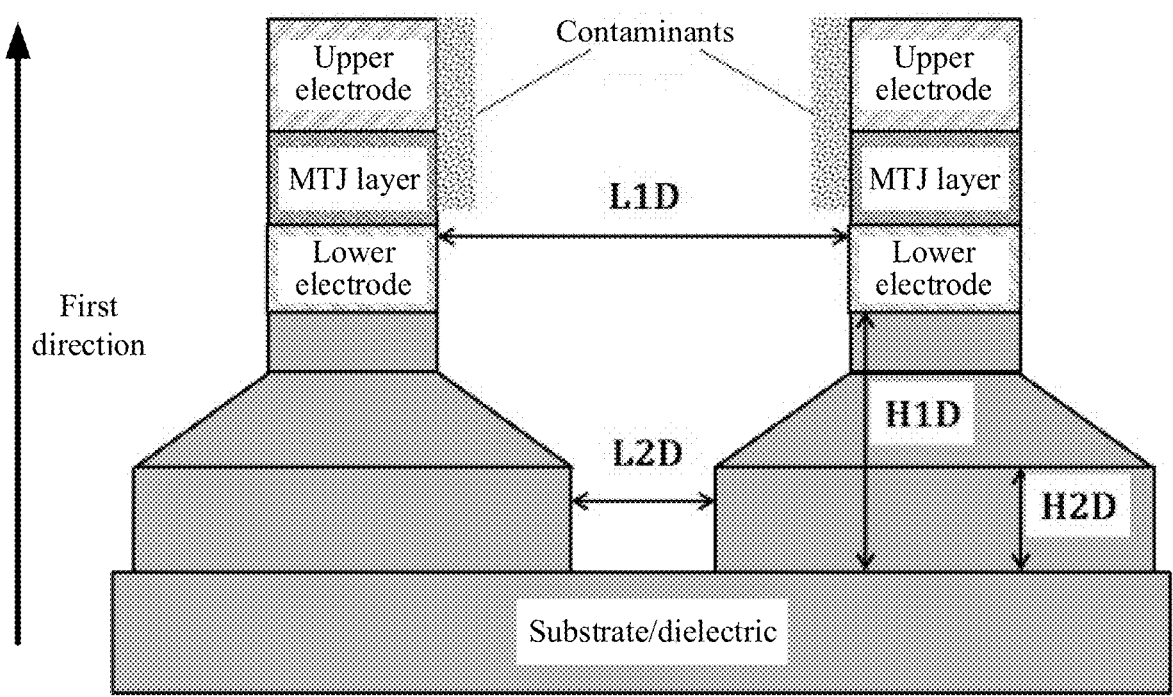
FIG. 22 is a schematic diagram of a structure fabricated through a method for controlling contaminants on a sidewall of a MTJ of a MRAM according to another embodiment of the present disclosure.

Reference is made to FIG. 22, which is a schematic diagram of a structure fabricated through a method for controlling contaminants on a sidewall of a MTJ of a MRAM according to another embodiment of the present disclosure. Using the foregoing processing parameters, the width of the bottom of the funnel-shaped trench is equal to L2D, the width between two adjacent lower electrodes is equal to L1D, the total thickness of the first part and the second part of the funnel-shaped trench along the first direction is equal to H1D, and the thickness of the second part of the funnel-shaped trench along the first direction is equal to H2D.

Compared with the structure shown in FIG. 20, there are L1D=L1B, L2D=L2B, H1D=H1B, and H2D<H2B.

That is, compared with the structure in the second example, the protrusion of the junction between the first part and the second part in the funnel-shaped trench is lowered, and thereby the blocking effect on the path of the sputtered metallic contaminants is further weakened.

A result of actual test shows that after the foregoing step of removing the metallic contaminants, there are metallic contaminants on the sidewall of the upper electrode and on an upper portion of the sidewall of the MTJ layer, while metallic contaminants does not cover the sidewall of the MTJ layer entirely to connect the upper electrode and lower electrode electrically. In such case, the device does not fail.

Fifth Example

In the IBE, the incident angle of the ion beam angle is 45°, the energy of ions is 200 V, the voltage for accelerating the ions is 200 V, the pressure in the etching chamber is 2 mT, the flow rate of the gas is 100 sccm, the gas is argon, and the etching stops at the interface between the substrate and the lower electrode.

In the RIE, the power of the source electrode is 200 W, the power of the bias electrode is 200 W, the pressure in the etching chamber is 10 mT, the flow rate of the gas is 200 sccm, the gas is argon, and the etching stops at a depth of 15 nm into the substrate.

Figure 23:
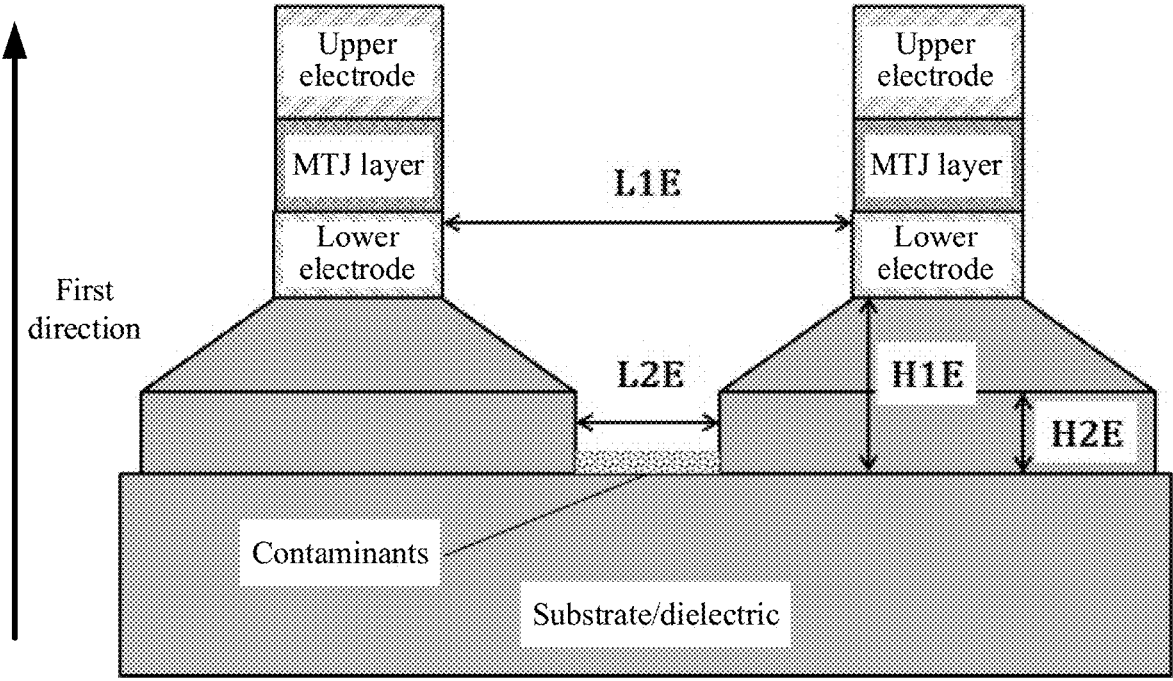
FIG. 23 is a schematic diagram of a structure fabricated through a method for controlling contaminants on a sidewall of a MTJ of a MRAM according to another embodiment of the present disclosure.

Reference is made to FIG. 23, which is a schematic diagram of a structure fabricated through a method for controlling contaminants on a sidewall of a MTJ of a MRAM according to another embodiment of the present disclosure. Using the foregoing processing parameters, the width of the bottom of the funnel-shaped trench is equal to L2E, the width between two adjacent lower electrodes is equal to L1E, the total thickness of the first part and the second part of the funnel-shaped trench along the first direction is equal to H1E, and the thickness of the second part of the funnel-shaped trench along the first direction is equal to H2E.

Compared with the structure as shown in FIG. 20, there are L1E=L1B, L2E=L2B, H1E<H1B, and H2E<H2B.

That is, compared with the structure in the second example, the funnel-shaped trench is shallower, and the cleaning effect on the contaminants in the trench is weak. Thereby, metallic contaminants transferred from the trench to the sidewall of MRAM structures would not be too many.

A result of actual test shows that no metallic contaminant is on the sidewall of the upper electrode and the sidewall of the MTJ layer after the foregoing step of removing the metallic contaminants. Hence, the device does not fail.

In an embodiment, another method for controlling contaminants on a sidewall of a MTJ of a MRAM is provided according to embodiment of the present disclosure. The method comprises following steps.

A base structure is provided. The base structure comprises a substrate, a lower electrode, a magnetic tunnel junction (MTJ) layer, and an upper electrode, which are arranged in the above-listed sequence along a first direction. The first direction is perpendicular to the substrate and points from the substrate to the lower electrode.

First etching is performed on a surface of the upper electrode away from the substrate, until the lower electrode is exposed. After the first etching, a portion of the MTJ layer close to the substrate tapers along the first direction, and a size of another portion of the MTJ layer is uniform along the first direction.

Second etching is performed subsequent to the first etching. After the second etching, a size of the whole the MTJ layer is uniform along the first direction, and a funnel-shaped trench is formed in the substrate and the lower electrode. The funnel-shaped trench comprises a first part in the lower electrode of the substrate and a second part in the substrate. The first part expands gradually along the first direction, and a size of the second part is uniform along the first direction.

Metallic contaminants at a bottom of the funnel-shaped trench are removed.

Figure 24:
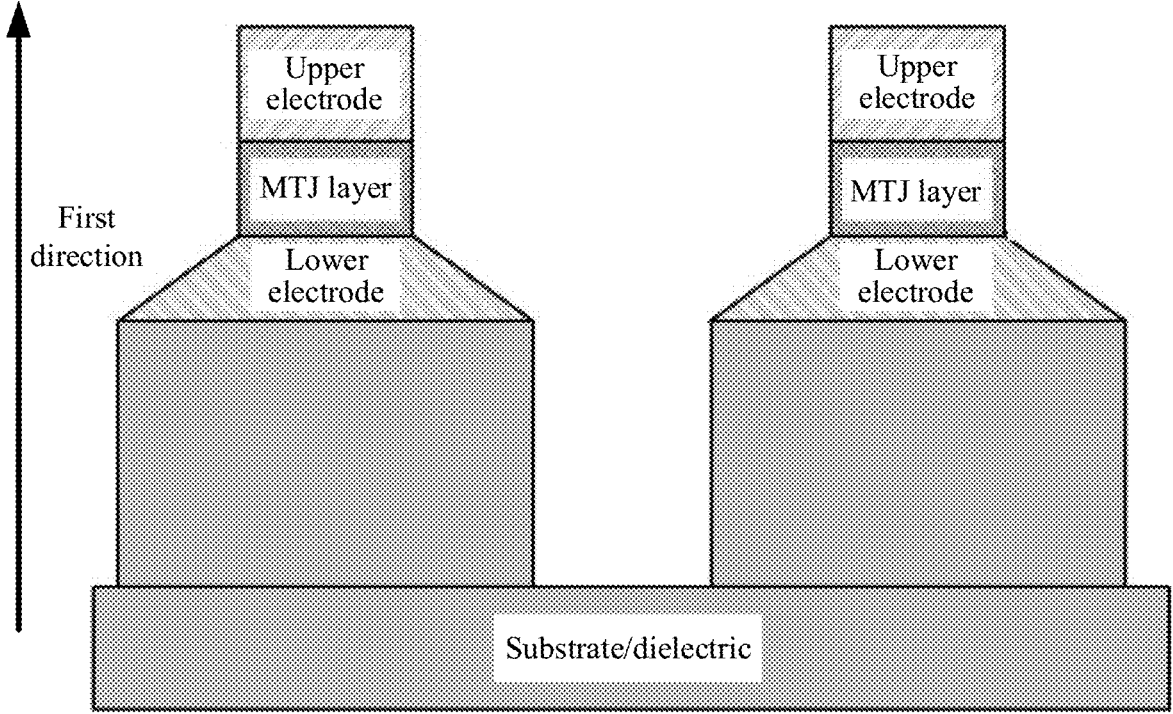
FIG. 24 is a schematic diagram of a structure fabricated through a method for controlling contaminants on a sidewall of a MTJ of a MRAM according to another embodiment of the present disclosure.

Reference is made to FIG. 24, which is a schematic diagram of a structure fabricated through a method for controlling contaminants on a sidewall of a MTJ of a MRAM according to another embodiment of the present disclosure. The structure as shown in FIG. 24 is also subject to the effect that few metallic contaminants adhere to the sidewall of the MTJ layer.

Herein description concerning a constant or uniform size along a certain direction utilizes theoretical terms, and refers to practical etching in which the size along such direction is not so strictly constant or uniform. A final product is limited by the practical processing.

Herein the substrate may be a dielectric layer made of multiple materials, and hence it is denoted as "substrate/dielectric" in the drawings. A specific material of the substrate is not limited herein.

Hereinabove the method for controlling the contaminants on the sidewall of the MTJ of the MRAM according to embodiments of the present disclosure is illustrated in detail. Specific embodiments are utilized herein to illustrate principles and implementations of the present disclosure. The description of the above embodiments is only intended for helping understand the method and core concepts of the present disclosure. Those skilled in the art may make modifications on specific implementations and application scenarios based on the concepts of the present disclosure. In summary, content of the present disclosure should not be construed as limitations of the present disclosure.

The embodiments of the present disclosure are described in a progressive manner, and each embodiment places emphasis on the difference from other embodiments. Therefore, one embodiment can refer to other embodiments for the same or similar parts. Since apparatuses disclosed in the embodiments correspond to methods disclosed in the embodiments, the description of the apparatuses is simple, and reference may be made to the relevant part of the methods.

The relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but conforms to a widest scope in accordance with principles and novel features disclosed in the present disclosure.

The invention claimed is:

1. A method for controlling contaminants on a sidewall of a magnetic tunnel junction (MTJ) of a magnetic random access memory (MRAM), comprising:

providing a base structure, wherein the base structure comprises a substrate, a lower electrode, a MTJ layer, and an upper electrode, which are arranged in the above-listed sequence along a first direction, and the first direction is perpendicular to the substrate and points from the substrate to the lower electrode;

performing first etching on a surface of the upper electrode away from the substrate, until the substrate is exposed, wherein after the first etching, a portion of the lower electrode adjacent to the substrate tapers along the first direction, and a size of another portion of the lower electrode is uniform along the first direction;

performing second etching after the first etching, wherein:

after the second etching, a size of the whole lower electrode is uniform along the first direction, and a funnel-shaped trench is formed in the substrate, the funnel-shaped trench comprises a first part away from a bottom surface of the substrate and a second part close to the bottom surface of the substrate, and the first part expands gradually along the first direction, and a size of the second part is uniform along the first direction; and removing metallic contaminants at a bottom of the funnel-shaped trench.

2. The method according to claim 1, wherein a distance Hs between a surface of the MTJ layer away from the upper electrode and a surface of the first part away from the second part is greater than or equal to a thickness G1 of the lower electrode along the first direction.

3. The method according to claim 1, wherein performing the first etching on the surface of the upper electrode away from the substrate until the substrate is exposed comprises:

performing the first etching on the surface of the upper electrode away from the substrate through ion beam etching, until the substrate is exposed.

4. The method according to claim 3, wherein in the ion beam etching, energy of ions ranges from 50 eV to 600 eV, a voltage for accelerating the ions ranges from 50 V to 1000 V, and a flow rate of a gas ranges from 10 sccm to 500 sccm.

5. The method according to claim 3, wherein a gas for the ion beam etching comprises one or more of: an inert gas, nitrogen, oxygen, a fluorine-based gas, an amine gas, carbon monoxide, carbon dioxide, and an alcohol gas.

6. The method according to claim 3, wherein before performing the first etching on the surface of the upper electrode away from the substrate, the method further comprises:

forming a mask layer on the surface of the upper electrode away from the substrate, wherein the mask layer comprises a plurality of mask units.

7. The method according to claim 6, wherein:

in the ion beam etching, an incident angle of an ion beam is greater than A1 and less than A3, and $$A1 = \arctan\left(\frac{X}{Y1}\right),\ A2 = \arctan\left(\frac{X}{Y2}\right),$$

$0 < A3 - A2 \leq 5°$, $Y1 = Y2 + Y3$, X is a distance between every two adjacent mask units of the plurality of mask units, Y2 is a total thickness of the lower electrode, the MTJ layer, and the upper electrode along the first direction, and Y3 is a thickness of each mask unit of the plurality of mask units along the first direction.

8. The method according to claim 3, wherein performing the second etching comprises performing the second etching through reactive ion etching.

9. The method according to claim 8, wherein in the reactive ion etching, a value of a direct-current bias voltage in volts is less than or equal to a value of energy of ions for the ion beam etching in electronvolts.

10. The method according to claim 8, wherein in the reactive ion etching, a selectivity ratio between dielectric etching and metal etching is greater than 1.5.

11. The method according to claim 8, wherein in the reactive ion etching, a thickness of a removed part of the substrate is greater than 10 nm.

12. The method according to claim 8, wherein in the reactive ion etching, power of a source electrode ranges from 100 W to 1000 W, power of a bias electrode ranges from 100 W to 1500 W, pressure in an etching chamber ranges from 2 mT to 20 mT, and a flow rate of a gas ranges from 10 sccm to 500 sccm.

13. The method according to claim 8, wherein a gas for the reactive ion etching comprises one or more of: an inert gas, nitrogen, oxygen, a fluorine-based gas, an amine gas, carbon monoxide, carbon dioxide, and an alcohol gas.

14. A method for controlling contaminants on a sidewall of a magnetic tunnel junction (MTJ) of a magnetic random access memory (MRAM), comprising:

providing a base structure, wherein the base structure comprises a substrate, a lower electrode, a MTJ layer, and an upper electrode, which are arranged in the above-listed sequence along a first direction, and the first direction is perpendicular to the substrate and points from the substrate to the lower electrode;

performing first etching on a surface of the upper electrode away from the substrate, until the lower electrode is exposed, wherein after the first etching, a portion of the MTJ layer close to the substrate tapers along the first direction, and a size of another portion of the MTJ layer is uniform along the first direction;

performing second etching after the first etching, wherein:

after the second etching, a size of the whole the MTJ layer is uniform along the first direction, and a funnel-shaped trench is formed in the substrate and the lower electrode, the funnel-shaped trench comprises a first part in the lower electrode of the substrate and a second part in the substrate, and the first part expands gradually along the first direction, and a size of the second part is uniform along the first direction; and removing metallic contaminants at a bottom of the funnel-shaped trench.

* * * * *